(12) United States Patent
Suzawa et al.

(10) Patent No.: US 6,515,336 B1
(45) Date of Patent: Feb. 4, 2003

(54) THIN FILM TRANSISTORS HAVING TAPERED GATE ELECTRODE AND TAPED INSULATING FILM

(75) Inventors: Hideomi Suzawa, Kanagawa (JP); Koji Ono, Kanagawa (JP); Hideto Ohnuma, Kanagawa (JP); Hirokazu Yamagata, Tokyo (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/664,359

(22) Filed: Sep. 18, 2000

(30) Foreign Application Priority Data

Sep. 17, 1999 (JP) .......................................... 11-264101

(51) Int. Cl.$^7$ ......................... H01L 29/04; H01L 31/20; H01L 31/036; H01L 27/01; H01L 27/12

(52) U.S. Cl. ......................... 257/350; 257/59; 257/72; 257/347

(58) Field of Search .......................... 257/59, 72, 347, 257/350, 351

(56) References Cited

U.S. PATENT DOCUMENTS

| | | | |
|---|---|---|---|
| 5,292,675 A | | 3/1994 | Codama |
| 5,643,826 A | | 7/1997 | Ohtani et al. |
| 5,834,328 A | * | 11/1998 | Jang ............................. 438/30 |
| 5,923,962 A | | 7/1999 | Ohtani et al. |
| 6,030,667 A | | 2/2000 | Nakagawa et al. |
| 6,031,290 A | | 2/2000 | Miyazaki et al. |
| 6,121,662 A | * | 9/2000 | Wu ............................. 257/369 |
| 6,160,272 A | * | 12/2000 | Arai et al. ..................... 257/72 |
| 6,188,108 B1 | * | 2/2001 | Yoon et al. ................... 257/347 |
| 6,288,413 B1 | * | 9/2001 | Kamiura et al. .............. 257/66 |

FOREIGN PATENT DOCUMENTS

| | | |
|---|---|---|
| JP | 6-120249 | 4/1994 |
| JP | 6-148685 | 5/1994 |
| JP | 7-130652 | 5/1995 |
| JP | 7-235680 | 9/1995 |
| JP | 8-274336 | 10/1996 |
| JP | 9-293600 | 11/1997 |

OTHER PUBLICATIONS

Specifications and Drawings for application Ser. No. 09/618,930, "Semiconductor Device and Manufacturing Method Thereof" Filing Date: Jul. 18, 2000.

Specifications and Drawings for application Ser. No. 09/619,732, "Semiconductor Device and Manufacturing Method Thereof" Filing Date: Jul. 19, 2000.

* cited by examiner

*Primary Examiner*—Ngân V. Ngô
(74) *Attorney, Agent, or Firm*—Eric J. Robinson; Robinson Intellectual Property Law Office, P.C.

(57) ABSTRACT

TFTs arranged in various circuits have structures that are suited for circuit functions, in order to improve operation characteristics and reliability of the semiconductor device, to lower consumption of electric power, to decrease the number of steps, to lower the cost of production and to improve the yield. The gradient of concentration of impurity element for controlling the conduction type in the LDD regions 622 and 623 of the TFT is such that the concentration increases toward the drain region. For this purpose, a tapered gate electrode 607 and a tapered gate-insulating film 605 are formed, and the ionized impurity element for controlling the conduction type is added to the semiconductor layer through the gate-insulating film 605.

58 Claims, 20 Drawing Sheets

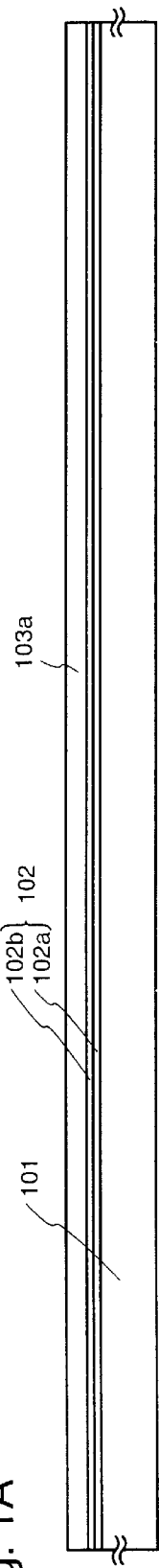
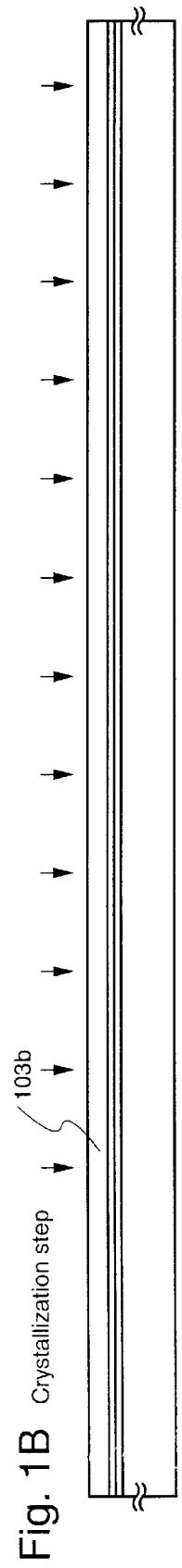
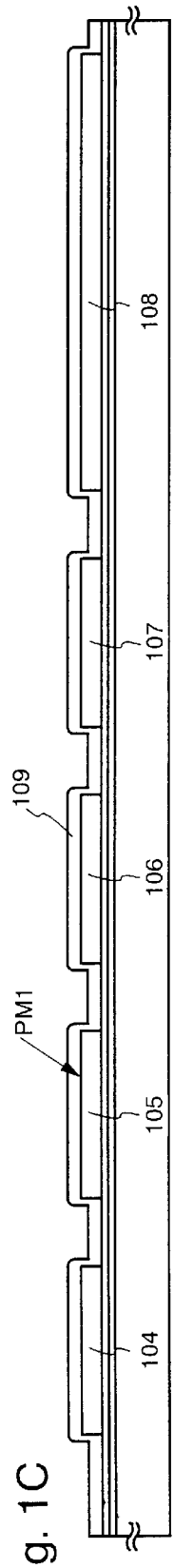
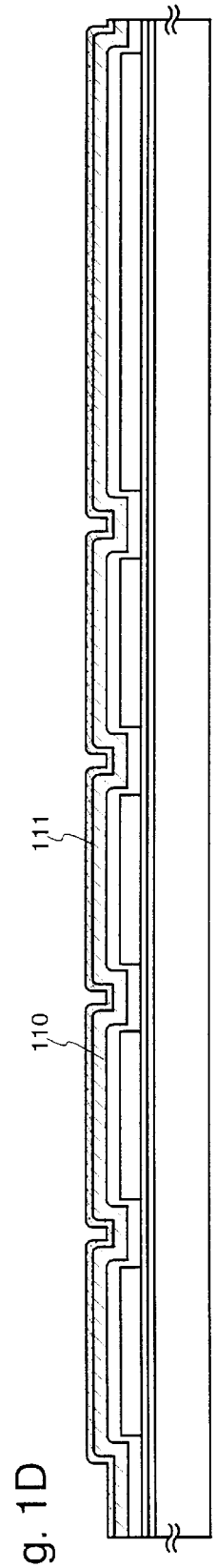
Fig. 1A
Fig. 1B Crystallization step
Fig. 1C
Fig. 1D

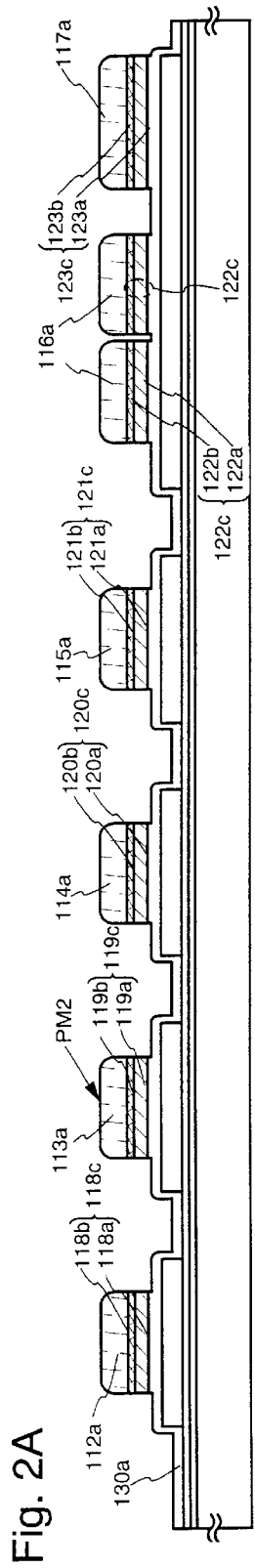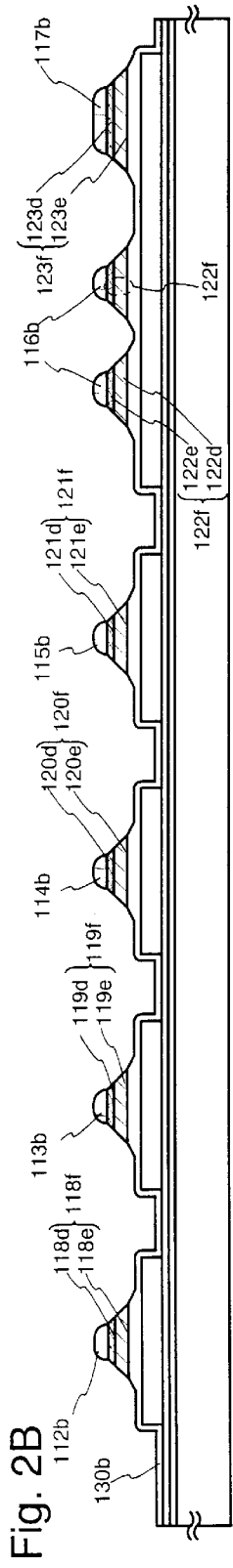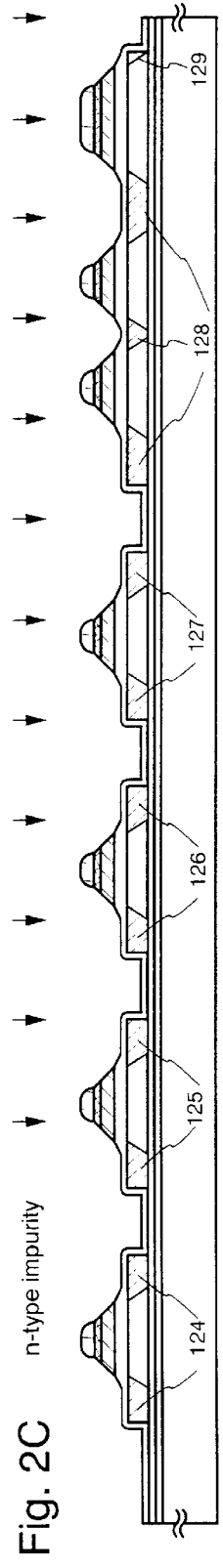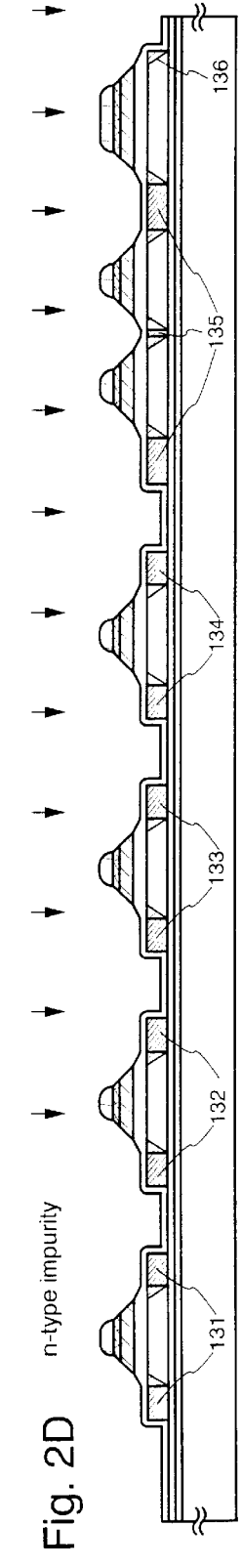

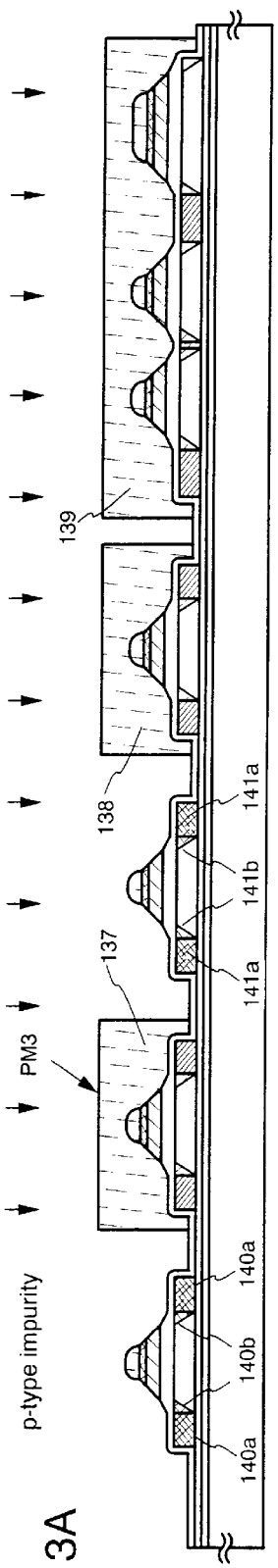
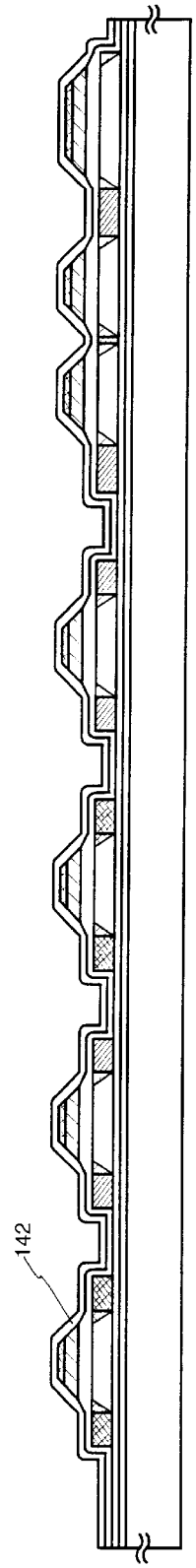
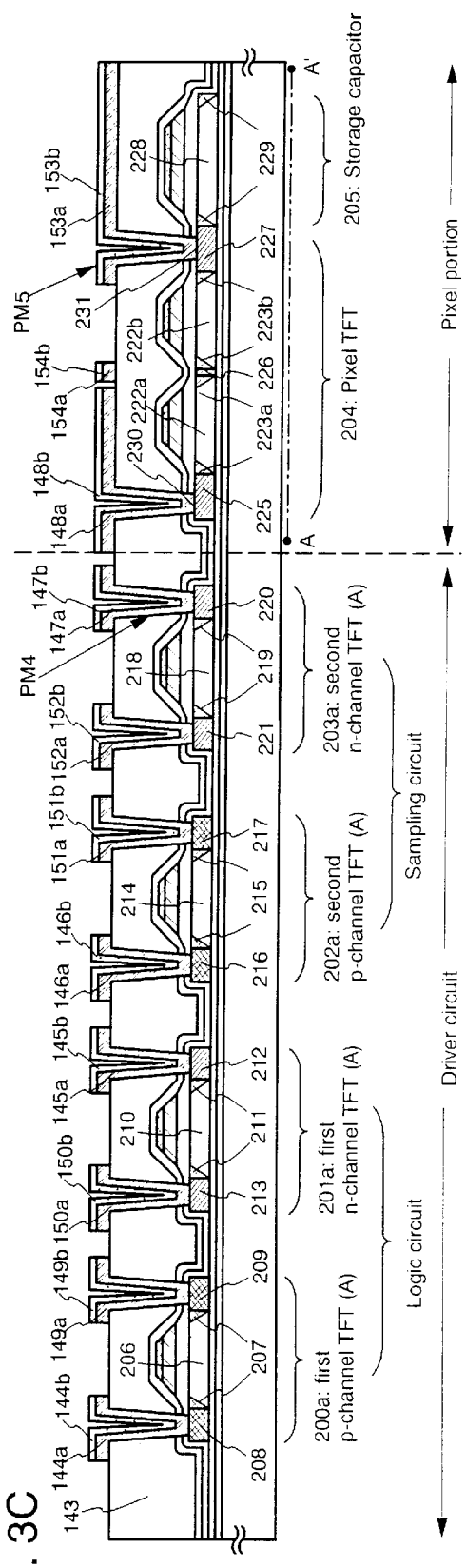

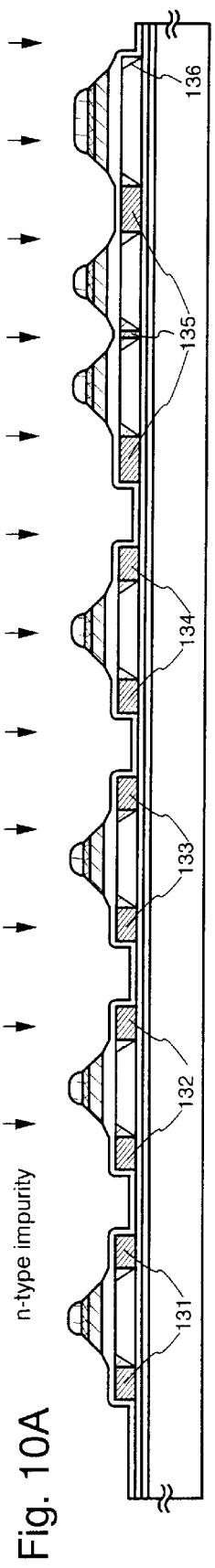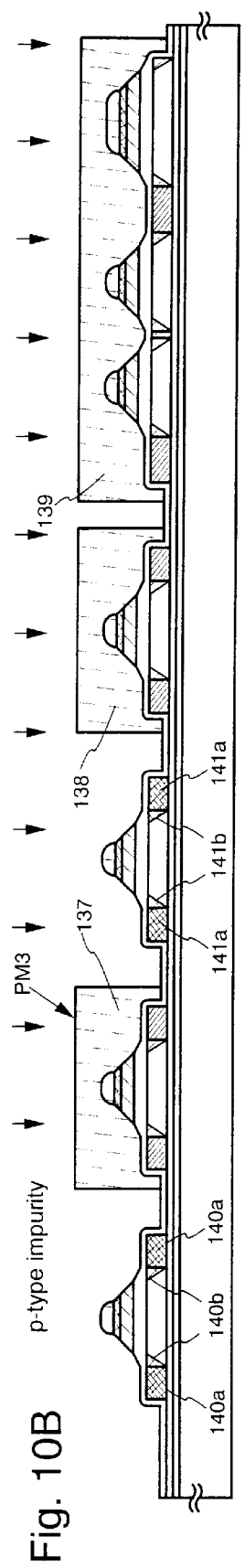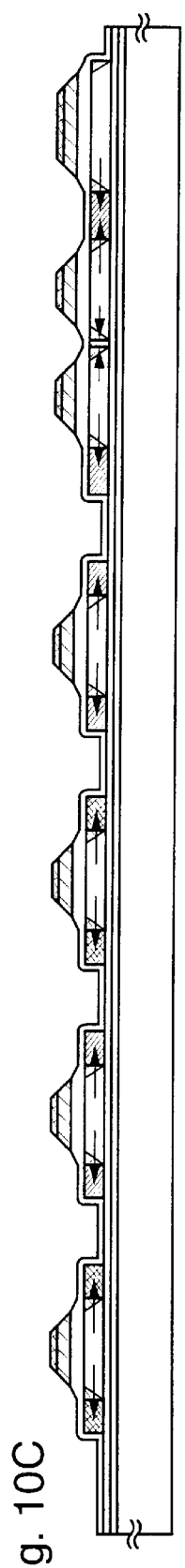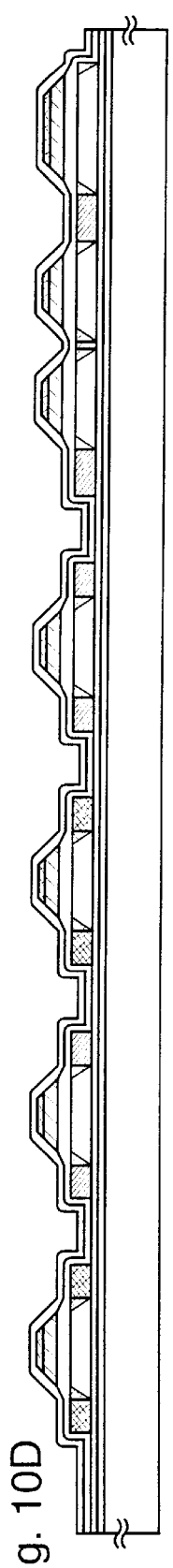

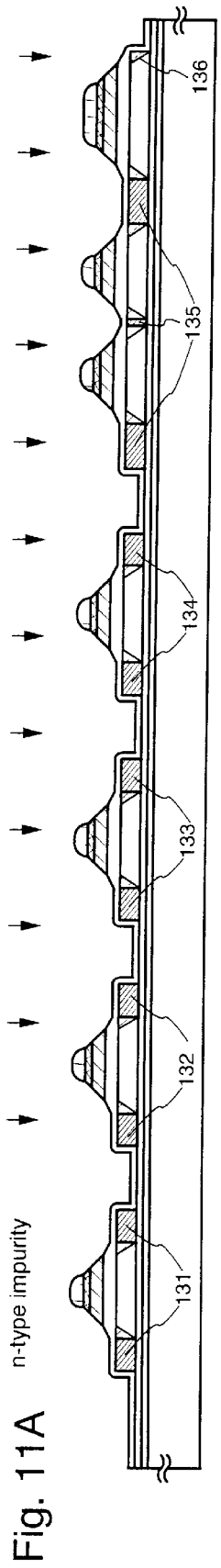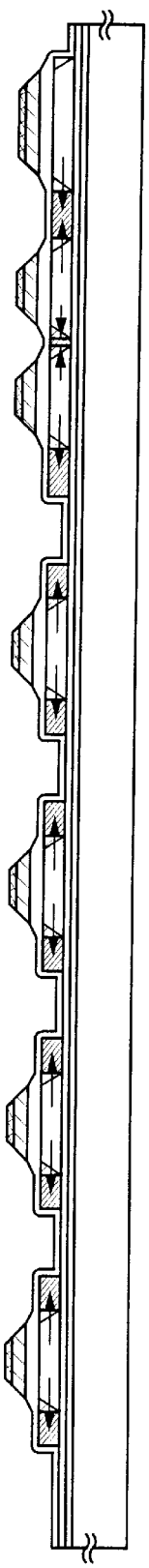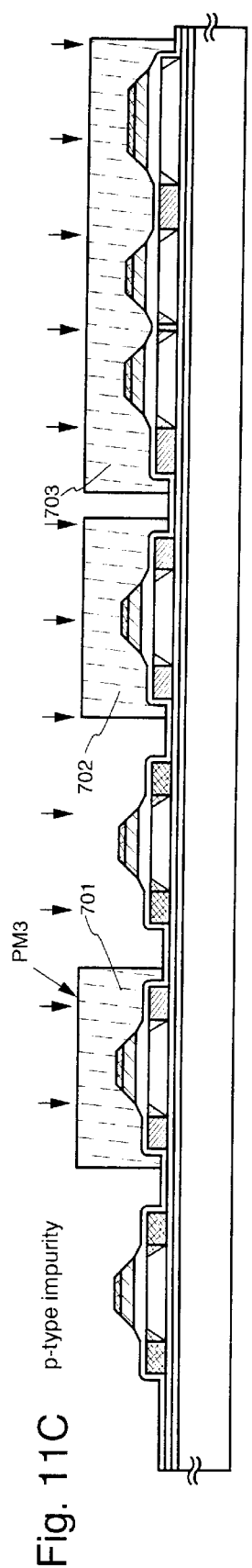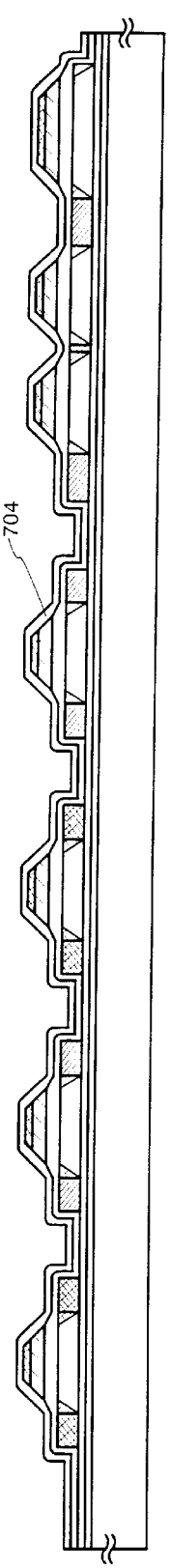
Fig. 11A  n-type impurity
Fig. 11B
Fig. 11C  p-type impurity
Fig. 11D

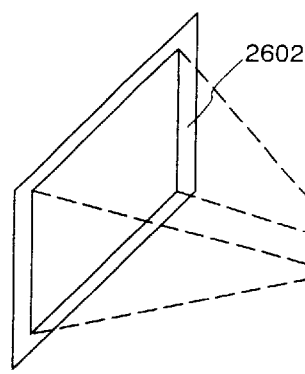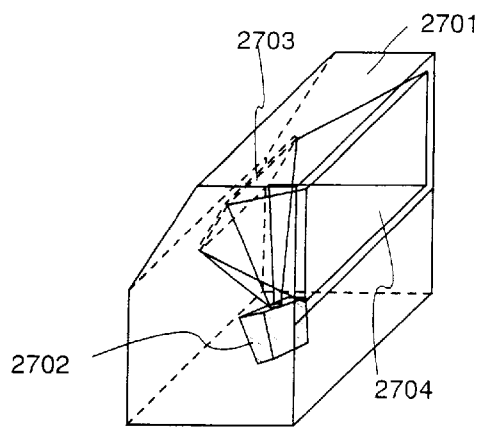
Fig. 20A          Fig. 20B
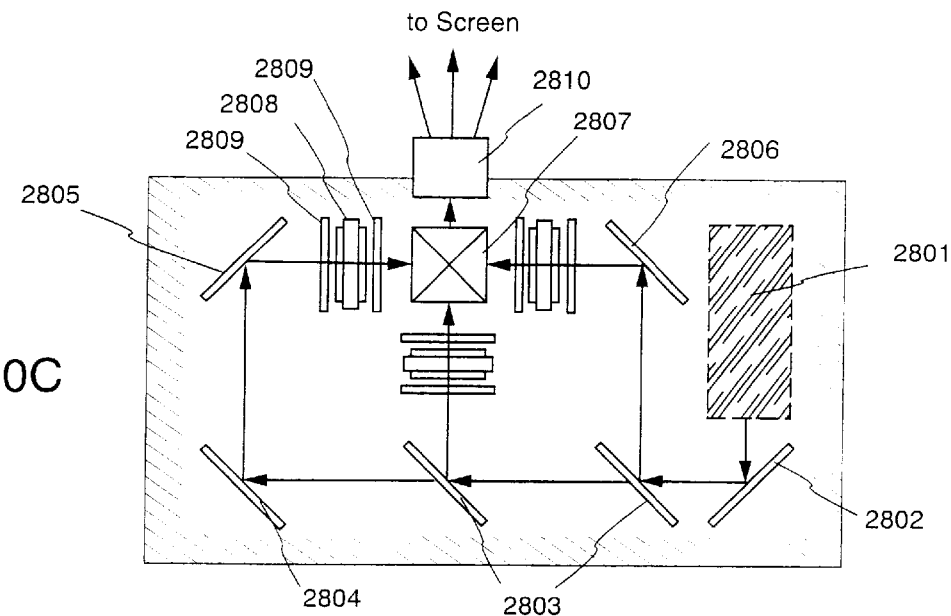
Fig. 20C
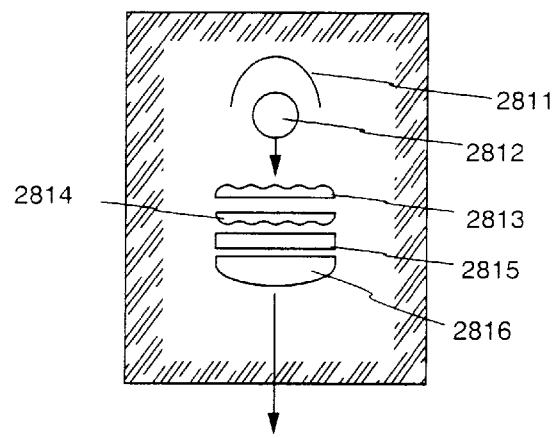
Fig. 20D

THIN FILM TRANSISTORS HAVING TAPERED GATE ELECTRODE AND TAPED INSULATING FILM

BACKGROUND OF THE INVENTION

1. Field of the Invention

The present invention relates to a semiconductor device having a circuit constituted by thin-film transistors (hereinafter abbreviated as TFTs) formed on a substrate having an insulating surface and to a method of fabricating the same. More particularly, the invention relates to an electro-optical device as represented by a liquid crystal display device having a pixel portion and a driver circuit formed in the periphery thereof on the same substrate, and technique that can be favorably utilized to electronic equipment mounting the electro-optical device. In this specification, the semiconductor device stands for devices that work by utilizing the semiconductor characteristics, in general, and encompasses the above-mentioned electro-optical device and electronic equipment mounting the electro-optical device.

2. Description of the Related Art

Technique for constituting switching elements and active circuits by using TFTs has been developed in connection with the electro-optical devices as represented by an active matrix-type liquid crystal display device. TFT is the one in which a semiconductor film is formed on a substrate such as of a glass by a vapor-phase growing method and is used as an active layer. As the semiconductor film, there is preferably used silicon or a material comprising chiefly silicon such as silicon-germanium. The semiconductor films can be classified into amorphous silicon films and crystalline silicon films as represented by polycrystalline silicon depending upon the method of formation.

The TFT using the amorphous semiconductor (typically, amorphous silicon) film is not capable of exhibiting an electric field effect mobility of not smaller than several square centimeters per Vsec due to electro-physical properties caused by the amorphous structure. In the liquid crystal display device of the active matrix type, therefore, the switching elements (pixel TFTs) can be formed for driving the liquid crystals in the pixel portion, but the driver circuit cannot be formed for displaying the picture. Therefore, the driver circuit is employing a technique for mounting a driver IC relying upon a TAB (tape automated bonding) system or a COG (chip on glass) system.

On the other hand, the TFT using, as an active layer, a semiconductor film including a crystal structure (hereinafter referred to as crystalline semiconductor) (typically, crystalline silicone or polycrystalline silicone), exhibits a high electric field effect mobility and makes it possible to form circuits of various functions on the same glass substrate and, hence, makes it possible to realize, in addition to pixel TFTs, a shift register circuit in a driver circuit, a level shifter circuit, a buffer circuit and a sampling circuit. Such circuits have been formed relying upon a CMOS circuit constituted by n-channel TFTs and p-channel TFTs. Owing to the above technique for mounting the driver circuits, it is becoming obvious that the TFTs having a crystalline semiconductor layer as an active layer is suited for forming the driver circuits in addition to the pixel portion on the same substrate, from the standpoint of decreasing the weight and thickness of the liquid crystal display device.

From the standpoint of TFT characteristics, it is better to use the crystalline semiconductor layer as an active layer. From the standpoint of fabricating the TFTs suited for various circuits in addition to the pixel TFTs, however, the steps of fabrication become complex and, besides, the number of the steps increase. It is obvious that an increase in the number of the steps drives up the cost of production and, besides, decreases the yield of production.

Further, in order to stabilize the operation of these circuits fabricated by using n-channel TFTs and p-channel TFTs, the threshold voltages and sub-threshold constants (S-values) of the TFTs must be confined within a predetermined range. For this purpose, the TFTs must be studied from both the structure and the materials constituting them.

SUMMARY OF THE INVENTION

The present invention deals with a technique for solving the above problems, and provides an electro-optical device as represented by a liquid crystal display device of the active matrix type fabricated by using the TFTs and a semiconductor device, wherein the TFTs arranged in the circuits have suitable structures depending upon the circuit functions, in order to improve operation characteristics and reliability of the semiconductor device, to decrease the consumption of electric power, to decrease the number of the steps, to decrease the cost of production and to improve the yield.

In order to decrease the cost of production and to improve the yield, the number of the steps may be decreased as one of the means. Concretely speaking, it is necessary to decrease the number of the photomasks required for the production of the TFTs. In the photolithographic technique, the photomask is used for forming, on the substrate, a resist pattern that serves as a mask in the etching step. Therefore, when the photomask is used, it means that there must be executed the steps of forming a film and etching before and after the step of using the photomask, as well as the steps of peeling the resist, washing and drying, as well as complex steps of applying the resist, prebaking, exposure to light, developing and post-baking even during the photolithography.

While decreasing the number of the photomasks, the TFTs arranged in various circuits have suitable structures depending upon the functions of the circuits. Concretely speaking, it is desired that the TFTs for the switching elements have a structure placing more importance on decreasing the off current than on the operation speed. For this structure, a multi-gate structure is employed. On the other hand, the TFTs used in the driver circuit that requires a high-speed operation should have a structure that places importance on the operation speed and on suppressing the deterioration caused by the injection of hot carriers, which is a serious problem. To accomplish this structure, contrivance is made to the LDD region of the TFT. That is, in the LDD region provided between the channel-forming region and the drain region, gradient is imparted to the concentration such that the concentration of impurity element for controlling the conduction type gradually increases toward the drain region. This constitution is effective in relaxing the concentration of the electric field in the depletion layer near the drain region.

In order to form the LDD region having such a gradient in the concentration of the impurity element according to this invention, the ionized impurity element for controlling the conduction type is accelerated through an electric field and is passed through the gate-insulating film (in this invention, both the gate-insulating film provided between the gate electrode and the semiconductor layer being intimately contacted thereto, and an insulating film extending in the peripheral region thereof from the gate-insulating film, are referred to as gate-insulating film) so as to be added to the semiconductor layer. In this specification, the method of adding the impurity element is called "through doping method" from the standpoint of convenience. In the through doping method of the invention, the gate electrode has a so-called tapered shape in which the thickness of the gate electrode gradually increases toward the inside from an end portion thereof. The gate-insulating film, too, has a tapered shape in which the thickness gradually increases toward a portion that comes in contact with the gate electrode. Upon conducting the through doping method, therefore, the concentration of the impurity element added to the semiconductor layer is controlled by the thickness of the tapered gate insulating film, making it possible to form an LDD region in which the concentration of the impurity element gradually changes in the direction of channel length of the TFT.

The gate electrode is formed by using a heat-resistant electrically conductive material such as tungsten (W), tantalum (Ta) or titanium (Ti), or a compound of the above element, or an alloy thereof. The heat-resistant electrically conductive material is etched at a high speed and precisely forming an end in a tapered shape, relying upon a dry-etching method using a high-density plasma. A high-density plasma can be obtained by using an etching device utilizing microwaves or inductively coupled plasma (ICP). In particular, the ICP etching device easily controls the plasma and makes it possible to treat even those substrates having large areas.

The plasma processing method using ICP and the plasma processing apparatus have been disclosed in Japanese Patent Laid-Open No. 9-293600. According to this publication, the plasma processing is executed highly precisely by forming a plasma by applying a high-frequency electric power to a multi-spiral coil in which four spiral coils are connected in parallel via an impedance matching unit. Here, each coil has a length equal to one-fourth the wavelength of a high frequency. Further, the lower electrode for holding the work, too, is applied with a bias voltage by separately applying a high-frequency electric power thereto.

FIG. 17A schematically illustrates the plasma processing apparatus (e.g., etching device) using the ICP. An antenna coil 903 is arranged on a quartz plate 905 provided in an upper part of reaction space, and is connected to a first high-frequency power source 901 through a matching box 907. The first high-frequency power source 901 has a frequency of 6 to 60 MHz and, typically, 13.56 MHz. A lower electrode 904 for holding a substrate 906 which is a work to be treated, is connected to a second high-frequency power source 902 through a matching box 912. The second high-frequency power source 902 has a frequency of 100 kHz to 60 MHz (e.g., 6 to 29 MHz). When a high-frequency electric power is applied to the antenna coil 903, a high-frequency current J flows into the antenna coil 903 in a direction θ, and a magnetic field B generates in the direction Z, $$\mu_0 J = \mathrm{rot}\, B \quad (1)$$

According to Faraday's electromagnetic induction rule, an induced electric field E generates in the direction θ, $$-\partial B/\partial t = \mathrm{rot}\, E \quad (2)$$

In the induced electric field E, the electrons are accelerated in the direction θ and come into collision with gas molecules to form a plasma. Since the electric field is induced in the direction θ, the probability is low in that the charged particles come into collision with the wall of the reaction chamber and the substrate to lose energy. The magnetic field B does not almost extend to the lower side of the antenna coil 903 and, hence, a high-density plasma region is formed extending like a flat plate. Upon adjusting the high-frequency electric power applied to the lower electrode 904, the plasma density and the bias voltages applied to the substrate 906 can be controlled independently of each other. It is further allowed to change the frequency of the high-frequency electric power depending upon the material of the work to be treated.

To obtain the inductively coupled plasma of a high density, the high-frequency current J must be supplied into the antenna coil with a low loss and, hence, the inductance must be decreased. This can be effectively done by splitting the antenna coil. FIG. 17B is a diagram illustrating the constitution thereof, wherein four spiral coils (multi-spiral coils) 910 are arranged on a quartz plate 911 and are connected to a first high-frequency power source 908 through a matching box 909. Here, if the length of each coil is set to be an integer times of one-fourth of the wavelength of the high frequency, a standing wave is formed on the coil enhancing a peak voltage that is generated.

The etching device using the ICP upon employing the multi-spiral coils makes it possible to favorably etch the heat-resistant electrically conductive material. The invention employs a dry etching device (Model E645-ICP) that uses ICP, manufactured by Matsushita Electric Industrial Co. FIG. 18 illustrates the results of examining the tapered shape at the end of the pattern of the tungsten film formed in a predetermined shape on a glass substrate. Here, the angle of the tapered portion is defined to be the one subtended by the surface of the substrate (horizontal plane) and the inclined portion of the tapered portion (angle denoted by θ1 in FIG. 5). Here, the common conditions comprise a discharge electric power (high-frequency electric power, 13.56 MHz applied to the coil) of 3.2 W/cm² and the use of an etching gas of $CF_4$ and $Cl_2$ maintaining a pressure of 1.0 Pa. FIG. 18A illustrates the dependency of bias power (13.56 MHz) applied to the substrate upon the angle θ1 of the tapered portion. The flowing rate of the etching gas is 30 SCCM for both $CF_4$ and $Cl_2$. It is obvious that the angle θ1 of the tapered portion can be varied over 70° to 20° with the bias power in a range of from 128 to 384 mW/cm². FIG. 18B illustrates the results of examining the dependency of the angle θ1 of the tapered portion upon the flow rate of the etching gas. The flow rate of the sum of $CF_4$ and $Cl_2$ was set to be 60 SCCM, and $CF_4$ only was varied over a range of 20 to 40 SCCM. The bias power at this moment was 128 mW/cm². As a result, the angle θ1 of the tapered portion could be varied over 60° to 80°.

As described above, the angle of the tapered portion varies greatly depending upon the bias power applied to the substrate. The angle of the tapered portion can be varied over 5° to 45° by further increasing the bias power and changing the pressure.

In this invention, the gate-insulating film in contact with the end of the gate electrode, too, is tapered. FIG. 5 is a view illustrating a portion of an n-channel TFT on an enlarged scale. Here, the angle of the tapered portion of the gate-insulating film is defined to be the one subtended by the surface of the substrate (horizontal plane) and the inclined portion of the tapered portion (angle θ2 in FIG. 5). The LDD region 623 is formed under the tapered portion 627 of the gate-insulating film. The distribution of concentration of phosphorus (P) in the LDD region is represented by a curve 625, and increases as it goes away from the channel-forming region 621.

The rate of increase varies depending upon the conditions such as acceleration voltage at the time of ion doping and dosage thereof, angles θ2 and θ1 of the tapered portions 627 and 628, and the thickness of the gate electrode 607. Thus, the end of the gate electrode and the gate-insulating film in the vicinity thereof are tapered, and impurity elements are added through the tapered portion in order to form an impurity region in which the concentration of the impurity element gradually changes in the semiconductor layer under the tapered portion. Further, the end 622 of the LDD region is overlapped on the gate electrode 607. Depending upon the doping conditions, however, the gate electrode and the LDD may be so arranged as will not be overlapped one upon the other.

Depending upon the etching conditions, further, the gate-insulating film may assume a shape as shown in FIG. 16A. An LDD region 1623 is formed under the tapered portion of the gate-insulating film shown in FIG. 16A. In FIG. 16A, reference numeral 1605 denotes a gate-insulating film, 1607 denotes a gate electrode, 1621 denotes a channel-forming region, 1622 denotes an LDD region superposed on the gate electrode, and 1624 denotes a source region or a drain region.

Depending upon the etching conditions, further, the gate-insulating film may assume a shape as shown in FIG. 16B. An LDD region 1723 is formed under the tapered portion of the gate-insulating film shown in FIG. 16A. In FIG. 16B, reference numeral 1705 denotes a gate-insulating film, 1707 denotes a gate electrode, 1721 denotes a channel-forming region, 1722 denotes an LDD region overlapped on the gate electrode, and 1724 denotes a source region or a drain region. In FIG. 16B, further, a step is formed in the tapered portion, and the region of a length L3 from the end of the gate electrode has the gate-insulating film of a thickness equal to the film thickness under the gate electrode.

Table 1 shows working characteristics of the heat-resistant electrically conductive material of before the gate electrode is formed by using the ICP etching apparatus. Shown here is an example of a molybdenum-tungsten (Mo—W) alloy (composition ratio of Mo:W=48:50% by weight) that is frequently used as a material of gate electrode in addition to the W film and the Ta film. Table 1 shows representative values related to the etching rate, etching gas that is used, and a selection ratio to the gate-insulating film that serves as an underlayer of the gate electrode. The gate-insulating film is a silicon oxide film or a silicon oxynitride film formed by the plasma CVD method. Here, the selection ratio is defined to be a ratio of the etching rate of the material to the etching rate of the gate-insulating film.

TABLE 1

| Material | Etching rate (nm/min) | Selection ratio to the gate-insulating film | Etching gas |
| --- | --- | --- | --- |
| W | 70 to 90 | 2 to 4 | $CF_4 + Cl_2$ |
| Ta | 140 to 160 | 6 to 8 | $Cl_2$ |
| Mo - W | 40 to 60 | 0.1 to 2 | $CF_4 + Cl_2$ |

The rate of etching the Ta film is 140 nm/min to 160 nm/min, the selection ratio thereof is 6 to 8, the rate of etching the W film is 70 nm/min to 90 nm/min, and the selection ratio thereof is 2 to 4, which are excellent values. From the standpoint of workability, therefore, the Ta film is suited. However, though not shown in Table 1, the Ta film has a resistivity of from 20 $\mu\Omega$cm to 30 $\mu\Omega$cm which is larger than 10 $\mu\Omega$cm to 16 $\mu\Omega$cm of the W film. On the other hand, Mo—W alloy exhibits an etching ratio of as slow as 40 nm/min to 60 nm/min and its selection ratio is from 0.1 to 2. Therefore, this material is not necessarily suited from the standpoint of workability. It is thus learned from Table 1 that the Ta film gives the best results. By taking the resistivity into consideration, however, it is considered that the W film is suited from an overall point of view.

Though the W film was described above as the heat-resistant electrically conductive material, the end of its pattern can be easily tapered by using the ICP etching apparatus. Then, the gate electrode is formed by the above method, and the through doping method is executed to control the concentration of the impurity element added to the semiconductor layer relying upon the thickness of the gate-insulating film. It is thus allowed to form the LDD region in which the concentration of the impurity element gradually changes in the lengthwise direction of the channel of the TFT.

By using the above means, the constitution of this invention is concerned with a semiconductor device comprising an active layer of a thin semiconductor film formed on a substrate having an insulating surface, an insulating film covering the active layer, and a gate electrode formed on the insulating film, wherein:

the active layer has a channel-forming region superposed on the gate electrode, a region of a low impurity concentration for forming the LDD region, and a source region or a drain region; and the insulating film on the region of a low impurity concentration has a thickness smaller than the thickness thereof on the channel-forming region but is larger than the thickness thereof on the source region or the drain region.

In the above constitution, the gate electrode has a tapered portion.

In the above constitution, further, the region of a low impurity concentration exists between the channel-forming region and the source region or between the channel-forming region and the drain region.

In the above constitution, further, the concentration of the p-type or n-type impurity element contained in the region of the low impurity concentration increases as it goes away from the channel-forming region.

In the above constitution, further, the source region or the drain region contains a p-type or an n-type impurity element at a concentration higher than the concentration of the p-type or n-type impurity element contained in the region of the low impurity concentration.

In the above constitution, further, the concentration of the p-type or n-type impurity element contained in the region of the low impurity concentration is from $1\times10^{16}$ atoms/cm$^3$ to $1\times10^{20}$ atoms/cm$^3$.

In the above constitution, further, the insulating film covering the active layer has a tapered portion, the length L2 of the tapered portion being from 0.1 $\mu$m to 1 $\mu$m in the lengthwise direction of the channel.

In the above constitution, further, the gate electrode is a single-layer film or a laminated-layer film of a heat-resistant electrically conductive material, and the heat-resistant electrically conductive material is an element selected from tantalum (Ta), titanium (Ti) and tungsten (W), or is a compound of the above element, or a compound of a combination of the above elements, or a nitride of the above element, or a silicide of the above element.

In the above constitution, further, the gate electrode is tapered at an angle of 5° to 35°.

To obtain the above constitution, further, the invention deals with a method of fabricating a semiconductor device having, formed on the same substrate, pixel TFTs provided in a pixel portion and a driver circuit including p-channel TFTs and n-channel TFTs in the peripheries of the pixel portion, comprising:

a first step of forming a semiconductor layer containing a crystalline structure on the substrate;

a second step of forming plural island-like semiconductor layers by selectively etching the semiconductor layer that contains the crystalline structure;

a third step of forming a gate-insulating film in contact with the island-like semiconductor layers;

a fourth step of forming an electrically conductive layer of a heat-resistant electrically conductive material on the gate-insulating film;

a fifth step of forming a gate electrode having a tapered portion and a gate-insulating film having a tapered portion by selectively etching the electrically conductive layer;

a sixth step of forming a region of a low n-type impurity concentration in the island-like semiconductor layers that form the n-channel TFTs of the driver circuit and the pixel TFTs by adding an n-type impurity element through the tapered portion of the gate-insulating film, the region of the low n-type impurity concentration having a gradient of concentration of the n-type impurity element in a direction in parallel with the substrate;

a seventh step of forming a region of a high n-type impurity concentration in the island-like semiconductor layers that form the n-channel TFTs of the driver circuit and the pixel TFTs by adding an n-type impurity element using the gate electrode as a mask:

an eighth step of forming a region of a low p-type impurity concentration in the island-like semiconductor layer that forms the p-channel TFTs of the driver circuit by adding a p-type impurity element through the tapered portion of the gate electrode and the gate-insulating film, the region of the low p-type impurity concentration having a gradient of concentration of the p-type impurity element in a direction in parallel with the substrate, and, at the same time, forming a region of a high p-type impurity concentration therein by adding a p-type impurity element without through the tapered portion of the gate electrode;

a ninth step of forming a first interlayer-insulating film of an inorganic insulating material on the n-channel TFTs of the driver circuit, on the pixel TFTs and on the p-channel TFTs;

a tenth step of forming a second interlayer-insulating film or an organic insulating material in contact with the first interlayer-insulating film; and an eleventh step of forming pixel electrodes connected to said pixel TFTs on said second interlayer-insulating film.

In the above-constitution, further, the fifth step of forming the gate electrode having the tapered portion and of forming the gate-insulating film having the tapered portion by selectively etching the electrically conductive layer, may be the one that is executed through one time of etching or may be the one that is executed through plural times of etching.

BRIEF DESCRIPTION OF THE DRAWINGS

FIGS. 1A to 1D are sectional views illustrating steps of fabricating pixel TFTs and TFTs in the driver circuit;

FIGS. 2A to 2D are sectional views illustrating steps of fabricating pixel TFTs and TFTs in the driver circuit;

FIGS. 3A to 3C are sectional views illustrating steps of fabricating pixel TFTs and TFTs in the driver circuit;

FIGS. 10A to 10D are sectional views illustrating steps of fabricating pixel TFTs and TFTs in the driver circuit;

FIGS. 11A to 11D are sectional views illustrating steps of fabricating pixel TFTs and TFTs in the driver circuit;

FIGS. 20A to 20D are views illustrating the constitution of a projection-type liquid crystal display device.

DESCRIPTION OF THE PREFERRED EMBODIMENTS

Figure 4A:
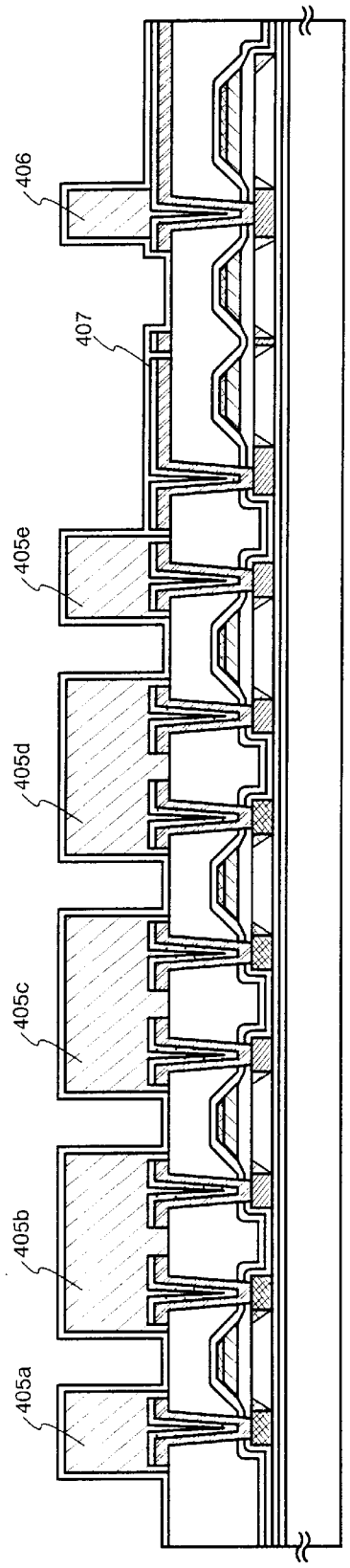
FIGS. 4A and 4B are sectional views illustrating steps of fabricating an active matrix-type liquid crystal display device.

Embodiments of the invention will now be described in detail.

[Embodiment 1]

An embodiment of the invention will now be described with reference to FIGS. 1A to 5. Described below in detail are the steps of a method of fabricating the pixel TFTs and storage capacitors in the pixel portion and the TFTs of a driver circuit provided in the periphery of the pixel portion.

In FIG. 1A, a substrate 101 may be a glass substrate such as of barium borosilicate glass or aluminoborosilicate glass as represented by a glass #7059 or a glass #1737 of Coning Co., or a plastic substrate without optical anisotropy such as of polyethylene terephthalate (PET), polyethylene naphthalate (PEN) or polyether sulfone (PES). When the glass substrate is to be used, the glass substrate may be heat-treated in advance at a temperature lower than the glass warping point by about 10° C. to 20° C. In order to prevent the diffusion of impurities from the substrate 101, a base film 102 which is an insulating film such as silicon oxide film, silicon nitride film or silicon oxinitride film, is formed on the surface of the substrate 101 on where the TFTs are to be formed. For example, the silicon oxynitride film 102*a* prepared from $SiH_4$, $NH_3$ and $N_2O$ is formed by the plasma CVD method maintaining a thickness of 10 nm to 200 nm (preferably, 50 nm to 100 nm) and, similarly, a hydrogenated silicon oxynitride film 102*b* prepared from $SiH_4$ and $N_2O$ is formed maintaining a thickness of 50 nm to 200 nm (preferably, 100 nm to 150 nm). Here, the base film 102 has a two-layer structure, which, however, may be a single-layer insulating film or a laminate of two or more insulating films.

The silicon oxynitride film is formed by the conventional parallel flat-plate type plasma CVD method. The silicon oxynitride film 102a is formed by introducing, into the reaction chamber, $SiH_4$ at a rate of 10 SCCM, $NH_3$ at a rate of 100 SCCM and $N_2O$ at a rate of 20 SCCM, maintaining a substrate temperature of 325° C., a reaction pressure of 40 Pa, a discharge power density of 0.41 W/cm² and a discharge frequency of 60 MHz. On the other hand, the hydrogenated silicon oxynitride film 102b is formed by introducing, into the reaction chamber, $SiH_4$ at a rate of 5 SCCM, $N_2O$ at a rate of 120 SCCM and $H_2$ at a rate of 125 SCCM, maintaining a substrate temperature of 400° C., a reaction pressure of 20 Pa, a discharge power density of 0.41 W/cm² and a discharge frequency of 60 MHz. These films can be continuously formed by simply varying the substrate temperature and changing over the reaction gas.

The thus formed silicon oxynitride film 102a has a density of $9.28 \times 10^{22}/cm^3$, exhibits an etching rate of as small as about 63 nm/min in a mixture solution (trade name, LAL500 manufactured by Sterachemipha Co.) containing 7.13% of ammonium hydrogenfluoride ($NH_4HF_2$) and 15.4% of ammonium fluoride ($NH_4F$) at 20° C. Use of this film as a base film is effective in preventing the diffusion of an alkali metal element from the glass substrate into the semiconductor layer formed thereon.

Next, a semiconductor layer 103a having a thickness of 25 to 80 nm (preferably, 30 to 60 nm) and an amorphous structure, is formed by a known method such as plasma CVD method or sputtering method. For example, the amorphous silicon film is formed maintaining a thickness of 55 nm by the plasma CVD method. The semiconductor film having amorphous structure is an amorphous semiconductor layer or a micro crystalline semiconductor film, and there may be used a compound semiconductor film having amorphous structure, such as amorphous silicon germanium film. Further, both the base film 102 and the amorphous semiconductor layer 103a can be continuously formed. For example, the silicon oxynitride film 102a and the hydrogenated silicon oxynitride film 102b are continuously formed by the plasma CVD method as described above and, then, the reaction gases are changed from $SiH_4$, $N_2O$ and $H_2$ over to $SiH_4$ and $H_2$ or to $SiH_4$ only, so as to be continuously formed without being exposed to the open air. This prevents the contamination on the surface of the hydrogenated silicon oxynitride film 102b and decreases dispersion in the characteristics and suppresses changes in the threshold voltage of the TFTs that are fabricated.

Then, the crystallization is effected to form a crystalline semiconductor layer 103b from the amorphous semiconductor layer 103a. This can be done by the laser annealing method or the thermal annealing method (solid-phase growing method), or by the rapid thermal annealing method (RTA method). When the above-mentioned glass substrate or a plastic substrate having inferior heat resistance is used, it is desired to employ the laser annealing method. The RTA method may use an infrared-ray lamp, a halogen lamp, a metal halide lamp or a xenon lamp as a source of light. It is further allowable to form the crystalline semiconductor layer 103b by the crystallizing method using a catalytic element according to technique disclosed in Japanese Patent Laid-Open No. 7-130652. In the step of crystallization, first, it is desired that hydrogen contained in the amorphous semiconductor layer is emitted. The heat treatment is effected at 400° C. to 500° C. for about one hour to decrease the amount of hydrogen to be not larger than 5 atom % and, then, the crystallization is effected preventing the surface of the film from being coarsened.

When the amorphous silicon film is formed by the plasma CVD method by using $SiH_4$ and argon (Ar) as reaction gases and heating the substrate at 400° C. to 450° C., the concentration of hydrogen in the amorphous silicon film can be decreased to be not larger than 5 atomic %. In this case, no heat treatment is required for releasing hydrogen.

When the crystallization is effected by the laser annealing method, the source of light is an excimer laser or an argon laser of a pulse oscillation type or a continuously emitting type. When the excimer laser of the pulse oscillation type is used, the laser beam is formed into a beam to effect the laser annealing. The laser annealing condition may be suitably selected by an operator, and in which the laser pulse oscillation frequency may be 30 Hz and the laser energy density may be 100 to 500 mJ/cm² (typically, 300 to 400 mJ/cm²). The whole surface of the substrate is irradiated with the linear beam. Here, the overlapping ratio of the linear beams is 80% to 98%. Thus, there is obtained the crystalline semiconductor layer 103b as shown in FIG. 1B.

Then, a first photomask (PM1) is formed on the crystalline semiconductor layer 103b, a resist pattern is formed by using the photolithography technique, the crystalline semiconductor layer is divided into the shape of islands by dry etching in order to form island-like semiconductor layers 104 to 108 as shown in FIG. 1C. The crystalline silicon film is dry-etched by using a mixed gas of $CF_4$ and $O_2$.

A p-type impurity element may be added to the whole surfaces of the island-like semiconductor layers at a concentration of about $1 \times 10^{16}$ to $5 \times 10^{17}$ atoms/cm³ in order to control the threshold voltage (Vth) of the TFTs. The impurity elements for imparting the p-type to the semiconductor are the elements of the Group 13 of periodic table, such as boron (B), aluminum (Al) and gallium (Ga). The impurities can be added by the ion injection method or the ion doping method (or ion shower doping method). Here, however, the ion doping method is suited for treating the substrate having a large area. In the ion doping method, boron (B) is added while using diborane ($B_2H_6$) as a source gas. The impurity element needs not necessarily be injected, but is injected to confine the threshold voltage of the n-channel TFT within a predetermined range.

The gate-insulating film 109 is formed by an insulating film containing silicon maintaining a thickness of 40 nm to 150 nm relying upon the plasma CVD method or the sputtering method. In this embodiment, the gate-insulating film 109 is formed from the silicon oxynitride film maintaining a thickness of 120 nm. The silicon oxynitride film formed by adding $O_2$ to $SiH_4$ and $N_2O$ is suited for this purpose since the fixed charge density therein is low. The gate-insulating film is in no way limited to the silicon oxynitride film only, as a matter of course, but may be an insulating film containing silicon having a single-layer structure or a laminated-layer structure. For example, the silicon oxide film is formed by the plasma CVD method by mixing a tetraethyl orthosilicate (TEOS) and $O_2$ together and conducting the electric discharge under a reaction pressure of 40 Pa, a substrate temperature of 300° C. to 400° C., at a high frequency (13.56 MHz) and a power density of 0.5 W/cm² to 0.8 W/cm². The thus formed silicon oxide film is then heat-annealed at 400° C. to 500° C. to obtain favorable properties as the gate-insulating film.

Referring next to FIG. 1D, a heat-resistant electrically conductive layer is formed on the gate-insulating film 109 to form a gate electrode. The heat-resistant electrically conductive layer may be formed as a single layer but may, as required, be formed in a laminated-layer structure having plural layers such as two layers or three layers. For example, the gate electrode is made of the heat-resistant electrically conductive material in a laminated-layer structure of an electrically conductive layer (A) 110 of an electrically conductive metal film and an electrically conductive layer (B) 111 of a metal nitride film. The electrically conductive layer (A) may be formed of an element selected from Ta, Ti or W, or an alloy of the above element, or an alloy of a combination of the above elements, and the electrically conductive layer (B) 111 may be formed of a tantalum nitride (TaN), a tungsten nitride (WN) or a titanium nitride (TiN). The electrically conductive layer (A) 110 may be formed of a tungsten silicide or a titanium silicide. It is desired that the electrically conductive layer (B) 111 has a low impurity concentration, the impurities being contained for decreasing the resistance. As for the oxygen concentration, in particular, it is desired that the concentration is not higher than 30 ppm. Upon selecting the oxygen concentration to be not larger than 30 ppm, for example, W exhibits a resistivity of not higher than 20 $\mu\Omega$cm.

The electrically conductive layer (A) 110 should be 200 nm to 400 nm (preferably, 250 nm to 350 nm), and the electrically conductive layer (B) 111 should be 10 nm to 50 nm (preferably, 20 nm to 30 nm). When the gate electrode is formed of W, the electrically conductive layer (A) 110 is formed by a W film maintaining a thickness of 250 nm by the sputtering method using W as a target and, then, an Ar gas and a nitrogen ($N_2$) are introduced to form the electrically conductive layer (B) 111 by the WN film maintaining a thickness of 50 nm. As another method, the W film may be formed by using tungsten hexafluoride ($WF_6$) by the thermal CVD method. In any way, the resistance must be decreased when the layer is used as a gate electrode and, hence, it is desired to set the resistivity of the W film to be not higher than 20 $\mu\Omega$cm. The resistance of the W film can be decreased by increasing the crystalline particles. When impurity element such as oxygen is contained in large amounts in W, however, the crystallization is impaired and the resistance increases. When the sputtering method is employed, therefore, a W target of a purity of 99.9999% is employed and, besides, the W film is formed by giving sufficient attention such that no impurity infiltrates into the film from the vapor phase, thereby to realize a resistivity of 9 $\mu\Omega$cm to 20 $\mu\Omega$cm.

Though not diagramed, it is recommended to form a silicon film doped with phosphorus (P) maintaining a thickness of about 2 nm to 20 nm under the electrically conductive layer (A). This makes it possible to improve the adhesiveness of the electrically conductive film formed thereon and to improve antioxidizing property and, at the same time, to prevent the alkali metal elements contained in trace amounts in the electrically conductive layer (A) 110 or in the electrically conductive layer (B) 111 from diffusing into the gate-insulating film 109. In any way, it is desired that the electrically conductive layer (B) 111 has a resistivity over a range of from 10 $\mu\Omega$cm to 50 $\mu\Omega$cm.

In this embodiment, the electrically conductive layer (A) 110 is formed of a W film for forming the gate electrode, and the electrically conductive layer (B) 111 is formed of a WN film. Next, by using a second photomask (PM2), resist masks 112a to 117a are formed by using the photolithography technique, and gate electrodes 118c to 122c and capacitor wiring 123c are formed by etching the electrically conductive layer (A) 110 and the electrically conductive layer (B) 111 at one time. The gate electrodes 118c to 122c and the capacitor wiring 123c, are formed of the electrically conductive layers (A) 118a to 123a and the electrically conductive layers (B) 118b to 123b integrally together on the gate-insulating film 130a (FIG. 2A).

Due to the etching at this moment, the thickness of the gate-insulating film is decreased in the region on where no resist mask is formed.

Then, at least the ends of the gate electrodes 118c to 122c are tapered by etching. The etching is conducted by using the ICP etching device. The technique for this is as described above in detail. As the concrete etching conditions, the etching was conducted by using a mixed gas of $CF_4$ and $Cl_2$ as an etching gas, setting the flow rates thereof to be 30 SCCM, respectively, with a discharge power of 3.2 W/cm$^2$ (13.56 MHz), with a bias power of 224 mW/cm$^2$ (13.56 MHz) and under a pressure of 1.0 Pa (FIG. 2B).

Upon conducting the etching under the above conditions, the end of the gate electrode is so tapered that the thickness gradually increases from the end toward the inside, and a gate electrode 118f comprising 118d and 118e is formed. Similarly, further, 119f, 120f, 121f, 122f and 123f are formed, the ends being tapered at angles of 5° to 35° and, preferably, at angles of 10° to 25°. The angle of the tapered portion of the gate electrode is denoted by θ1 in FIG. 5. This angle greatly affects the gradient of concentration in the region of a low n-type impurity concentration where the LDD region will be formed at a subsequent step. The angle θ1 of the tapered portion is expressed as Tan (θ1)=HG1/L1 by using the length (L1) of the tapered portion and the thickness (HG1) of the tapered portion.

In this embodiment, further, an over-etching is effected at a ratio of about 10% to 20% by increasing the etching time. Therefore, the exposed surface of the gate-insulating film is etched by about 20 to 50 nm and became substantially thin. The resist masks 112a to 117a are etched, too, to form resist masks 112b to 117b of a small shape. As a result, there is formed a gate-insulating film 130b that is tapered at a portion that comes into contact with an end of the gate electrode. The angle of the tapered portion of the gate-insulating film 130b is denoted by θ2 in FIG. 5. This angle greatly affects the gradient of concentration in the region of a low n-type impurity concentration where the LDD region will be formed at a subsequent step. The angle θ2 of the tapered portion is expressed as Tan (θ2)=HG2/L2 by using the length (L2) of the tapered portion of the gate-insulating film and the thickness (HG2) of the tapered portion.

In order to form the LDD region for the pixel TFTs and n-channel TFTs of the driver circuit, an n-type impurity element is added (n–doping step). The resist masks 112a to 117a used for forming the gate electrode are left, and an n-type impurity element is added by the ion doping method in a self-aligned manner using, as a mask, the gate electrodes 118c to 122c having tapered ends. Here, the n-type impurity element is so added as to reach the underlying semiconductor layer through the tapered portion of the gate-insulating film that comes into contact with the end of the gate electrode. For this purpose, the dosage is set to be $1\times10^{13}$ to $5\times10^{14}$ atoms/cm$^2$ and the acceleration voltage is set to be 60 atoms/cm$^2$ to 100 keV. As the impurity element for imparting n-type, there is used an element pertaining to the Group 15 and, typically, phosphorus (P) or arsenic (As). Here, however, phosphorus (P) is used. Relying on this ion doping method, phosphorus (P) is added to the semiconductor layer at a concentration over a range of from $1\times10^{16}$ atoms/cm$^3$ to $1\times10^{19}$ atoms/cm$^3$. Thus, the regions 124 to 129 of a low n-type impurity concentration are formed in the island-like semiconductor layers as shown in FIG. 2C.

In the regions 124 to 128 of a low n-type impurity concentration, the gradient of phosphorus (P) concentration reflects a change in the thickness of the film on the tapered portion of the gate-insulating film. This is because, the concentration of phosphorus (P) reaching the semiconductor layer changes depending upon a difference in the thickness of the film on the tapered portion of the gate-insulating film. In practice, further, phosphorus is added even into the lower portion of the tapered end of the gate electrode through the gate electrode. That is, the concentration of phosphorus (P) added to the regions 124 to 128 of a low n-type impurity concentration, gradually decreases toward the channel-forming region.

In FIG. 2C, the ends of the regions 124 to 129 of a low n-type impurity concentration are shown being inclined. This, however, is not to directly represent the regions to where phosphorus (P) is added but represents a change in the concentration of phosphorus along the shape of the gate-insulating film as described above.

Next, a region of a high n-type impurity concentration that works as a source region or a drain region is formed in the n-channel TFT ($n^+$ doping step). The resist masks 112b to 117b are left and, then, the impurities are added by the ion doping method at an acceleration voltage of 40 keV to 100 keV such that the gate electrodes 118f to 122f serve as masks for shielding phosphorus (P). Thus, the regions 131 to 136 of a high n-type impurity concentration are formed. Due to the over-etching executed for the gate electrode, the gate-insulating film 130 in this region is etched, too, to possess a thickness of 70 nm to 100 nm which is a reduction from the initial thickness of 120 nm. Therefore, phosphorus (P) can be favorably added even under such a low acceleration voltage condition. The concentration of phosphorus (P) in this region is set to lie over a range of from $1\times10^{20}$ atoms/cm$^3$ to $1\times10^{21}$ atoms/cm$^3$ (FIG. 2D).

Then, regions 140a, 140b, 141a and 141b of a high p-type impurity concentration that work as a source region and a drain region are formed in the island-like semiconductor layers 104 and 106 forming the p-channel TFTs. Here, the regions of a high p-type impurity concentration are formed in a self-aligned manner by adding a p-type impurity element using gate electrodes 118 and 120 as masks. By using a third photomask (PM3), here, resist masks 137 to 139 are formed to cover the whole surfaces of the island-like semiconductor layers 105, 107 and 108 that form n-channel TFTs. Here, the impurity regions 140 and 141 are formed by the ion doping method using diborane ($B_2H_6$). The boron (B) concentration is set to be $3\times10^{20}$ atoms/cm$^3$ to $3\times10^{21}$ atoms/cm$^3$ in the regions 140a and 141a of a high p-type impurity concentration that are not overlapped on the gate electrode. The impurity element is added into the impurity regions 140b and 141b through the gate-insulating film and the tapered portion of the gate electrode. Therefore, the impurity regions 140b and 141b contain the p-type impurities at a substantially low concentration which is at least not lower than $1.5\times10^{19}$ atoms/cm$^3$. Phosphorus (P) has been added through the above step into the regions 140a and 141a of a high p-type impurity concentration and into the regions 140b and 141b of a low p-type impurity concentration. Namely, the regions 140a, 141a of a high p-type impurity concentration contains impurities at a concentration of $1\times10^{20}$ atoms/cm$^3$ to $1\times10^{21}$ atoms/cm$^3$ and the regions 140b, 141b of a low p-type impurity concentration contains impurities at a concentration of $1\times10^{16}$ atoms/cm$^3$ to $1\times10^{19}$ atoms/cm$^3$. The concentration of boron (B) added through this step is set to be from 1.5 to 3 times as large as the phosphorus (P) concentration without causing any problem to the source region and the drain region of the p-channel TFT. (FIG. 3A)

Referring next to FIG. 3B, a first interlayer insulating film 142 is formed to cover the gate electrode and the gate-insulating film. The first interlayer-insulating film 142 may be formed of a silicon oxide film, a silicon oxynitride film, a silicon nitride film or a laminated-layer film of a combination thereof. In any way, the first interlayer-insulating film 142 is formed of an inorganic insulating material. The first interlayer-insulating film 142 has a thickness of from 100 nm to 200 nm. Here, the silicon oxide film is formed by the plasma CVD method by mixing TEOS and $O_2$, and by effecting the electric discharge under a reaction pressure of 40 Pa, at a substrate temperature of 300° C. to 400° C., at a high frequency (13.56 MHz) and at a power density of 0.5 W/cm$^2$ to 0.8 W/cm$^2$. Further, the silicon oxynitride film is formed from $SiH_4$, $N_2O$ and $NH_3$ by the plasma CVD method, or is formed from $SiH_4$ and $N_2O$. In this case, the conditions of formation are a reaction pressure of 20 Pa to 200 Pa, a substrate temperature of 300° C. to 400° C., a frequency of 60 MHz and a power density of 0.1 W/cm$^2$ to 1.0 W/cm$^2$. There may be formed a hydrogenated silicon oxynitride film from $SiH_4$, $N_2O$ and $H_2$. Similarly, the silicon nitride film may be prepared from $SiH_4$ and $NH_3$ by the plasma CVD method.

Thereafter, the n-type and p-type impurity elements added at their respective concentrations are activated. This step is conducted by a thermal annealing method using an annealing furnace. There can be further used a laser annealing method or a rapid thermal annealing method (RTA method). The thermal annealing method is conducted in a nitrogen atmosphere having an oxygen concentration of not higher than 1 ppm and, preferably, not higher than 0.1 ppm at 400° C. to 700° C. and, typically, at 500° C. to 600° C. In this embodiment, the heat-treatment is conducted at 550° C. for 4 hours. When a plastic substrate having a low heat resistance is used as the substrate 101, it is recommended to employ the laser annealing method (FIG. 3B).

Following the step of activation, a step is conducted for hydrogenating the island-like semiconductor layers by changing the atmosphere gas and executing the heat treatment at 300° C. to 450° C. for 1 to 12 hours in an atmosphere containing 3 to 100% of hydrogen. This step is to terminate $10^{16}$ to $10^{18}$/cm$^3$ of dangling bonds in the island-like semiconductor layers with thermally excited hydrogen. As another hydrogenation means, there may be employed a plasma hydrogenation (using hydrogen excited by plasma). In any way, it is desired to suppress the density of defects in the island-like semiconductor layers 104 to 108 to be not larger than $10^{16}$/cm$^3$. For this purpose, hydrogen needs be added in an amount of about 0.01 atomic % to 0.1 atomic %.

After the steps of activation and hydrogenation have been finished, a second interlayer-insulating film 143 of an organic insulating material is formed maintaining an average thickness of 1.0 μm to 2.0 μm. As the organic resin material, there can be used a polyimide, acrylic resin, polyamide, polyimideamide, BCB (benzocyclobutene) or the like. For example, a polyimide is formed by being thermally polymerized after it is applied onto the substrate, followed by firing at 300° C. in a clean oven. There may be used an acrylic resin of a two-can type. A chief material and a curing agent are mixed together. The mixture is applied onto the whole surface of the substrate by using a spinner, pre-heated at 80° C. for 60 seconds by using a hot plate and is, then, fired at 250° C. for 60 minutes in a clean oven.

Upon forming the second interlayer-insulating film using an organic insulating material as described above, it is allowed to favorably flatten the surface. Besides, the organic resin material, generally, has a low dielectric constant and makes it possible to lower the parasitic capacitance. Due to its hygroscopic property, however, the organic resin material is not suited as a protection film. Like in this embodiment, therefore, it may be used in combination with a silicon oxide film, a silicon oxynitride film or a silicon nitride film that is formed as a first interlayer-insulating film 142.

Then, by using a fourth photomask (PM4), a resist mask of a predetermined pattern is formed, and contact holes are formed to reach the source regions or the drain regions formed in the island-like semiconductor layers. The contact holes are formed by the dry-etching method. In this case, the second interlayer-insulating film 143 of an organic resin material is, first, etched using a mixed gas of $CF_4$, $O_2$ and He as an etching gas and, then, the first interlayer-insulating film 142 is etched using $CF_4$ and $O_2$ as an etching gas. In order to enhance the selection ratio to the island-like semiconductor layers, further, the gate-insulating film 130 is etched by changing the etching gas over to $CHF_3$ to favorably form the contact holes.

Then, the electrically conductive metal film is formed by the sputtering method or the vacuum vaporization method, a resist mask pattern is formed by using a fifth photomask (PM5), and source wirings 144 to 148 and drain wirings 149 to 153 are formed by etching. Here, the drain wiring 153 works as a pixel electrode. The drain wiring 154 represents a pixel electrode that pertains to a neighboring pixel. In this embodiment, though not diagramed, the wiring is formed by a Ti film maintaining a thickness of 50 nm to 150 nm, a semiconductor and contacts are formed to form source regions or drain regions of the island-like semiconductor layers, aluminum (Al) is formed maintaining a thickness of 300 nm to 400 nm on the Ti film (denoted by 144a to 154a in FIG. 3C) and, then, a transparent electrically conductive film is formed thereon maintaining a thickness of 80 nm to 120 nm (denoted by 144b to 154b in FIG. 3C). As the transparent electrically conductive film, there can be suitably used an indium oxide-zinc oxide alloy ($In_2O_3$—ZnO) or a zinc oxide (ZnO), or a zinc oxide (ZnO:Ga) to which gallium (Ga) is added to enhance the visible light transmission factor and electrically conductive property.

By using five pieces of photomasks as described above, there are formed, on the same substrate, TFTs of the driver circuit and TFTs of the pixel portion. In the driver circuit are formed a first p-channel TFT (A) 200a, a first n-channel TFT (A) 201a, a p-channel TFT (A) 202a, a second n-channel TFT (A) 203a, and in the pixel portion are formed a pixel TFT 204 and a storage capacity 205. In this specification, this substrate is called active matrix substrate for convenience.

The first p-channel TFT (A) 200a in the driver circuit has a structure in which a channel-forming region 206, LDD regions 207, and a source region 208 and a drain region 209 which are regions of a high p-type impurity concentration, are formed in the island-like semiconductor layer 104. A first n-channel TFT (A) 201a has a channel-forming region 210, LDD regions 211 which are regions of a low n-type impurity concentration and a source region 212 and a drain region 213 which are regions of a high n-type impurity concentration, that are formed in the island-like semiconductor layer 105. The LDD regions are denoted by Lov and have a length of 30 nm to 250 nm in the direction of channel length which is from 3 μm to 7 μm. The length of Lov is controlled from the thickness of the gate electrode 119 and the angle θ1 of the tapered portion.

Figure 5:
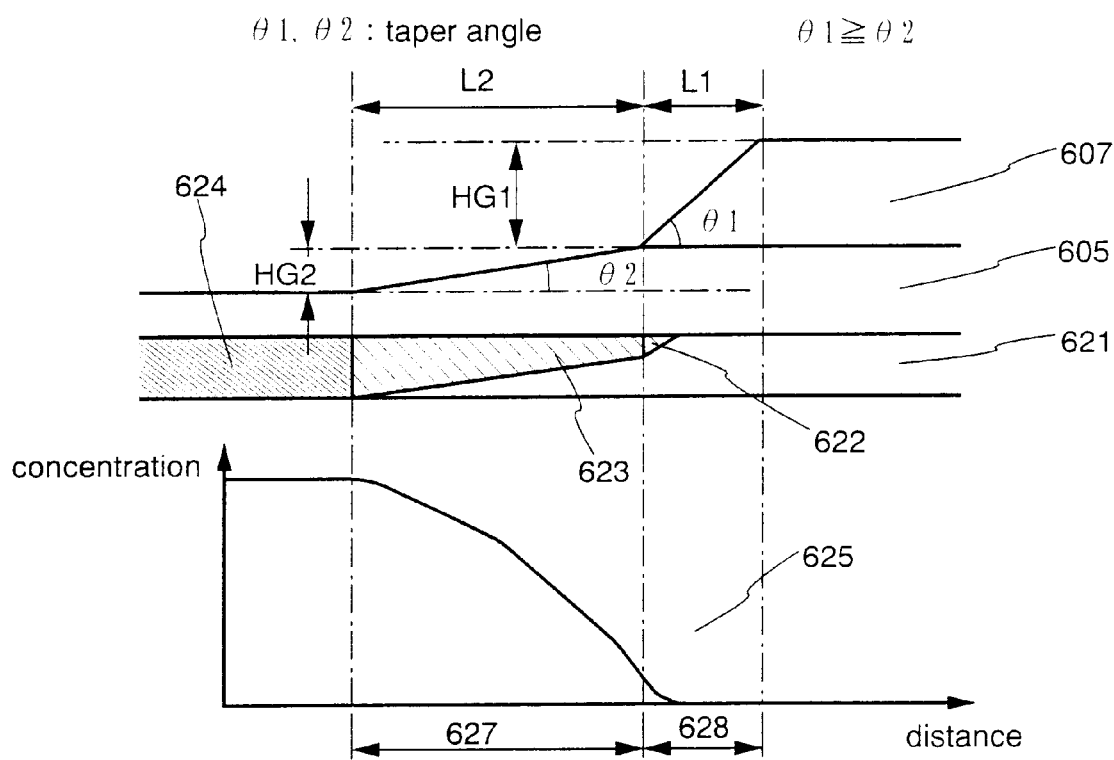
FIG. 5 is a diagram illustrating the structure of an LDD region of an n-channel TFT.

The LDD regions will now be described with reference to FIG. 5. What is shown in FIG. 5 is a partial enlarged view of the first n-channel TFT (A) 201a that is shown in FIG. 3C.

An LDD region 622 is formed under a tapered portion 628 of the gate electrode. Further, an LDD region 623 is formed under a tapered portion 627 of the gate-insulating film and adjacent to source or drain region 624. Here, the distribution of phosphorus (P) concentration in the two LDD regions is represented by a curve 625, and increases as it goes away from the channel-forming region 621. The rate of increase differs depending upon the conditions such as acceleration voltage during the ion doping and dosage, angles θ2, θ1 of the tapered portions 627, 628, and thickness of the gate electrode 607.

Thus, the end of the gate electrode and the gate-insulating film in the vicinity thereof are tapered, and the impurity element is added through the tapered portions, in order to form an impurity region in which the concentration of the impurity element gradually changes in the semiconductor layer under the tapered portions. In the LDD region 622, the minimum impurity concentration range is from $1\times10^{16}$ atoms/$cm^3$ to $1\times10^{17}$ atoms/$cm^3$ and the maximum impurity concentration range is from $1\times10^{17}$ atoms/$cm^3$ to $1\times10^{18}$ atoms/$cm^3$. In the LDD region 623, further, the minimum impurity concentration range is from $1\times10^{17}$ atoms/$cm^3$ to $1\times10^{18}$ atoms/$cm^3$ and the maximum impurity concentration range is from $1\times10^{19}$ atoms/$cm^3$ to $1\times10^{20}$ atoms/$cm^3$. Formation of the purity regions relaxes a high electric field generated near the drain region in the n-channel TFT, prevents the occurrence of hot carriers, prevents the TFTs from being deteriorated and, at the same time, lowers the off-current value.

Similarly, the second p-channel TFT (A) 202a in the driver circuit has a structure in which a channel-forming region 214, LDD regions 215, and a source region 216 and a drain region 217 which are regions of a high p-type impurity concentration, are formed in the island-like semiconductor layer 106. A second n-channel TFT (A) 203a has a channel-forming region 218, LDD regions 219, and a source region 220 and a drain region 221 which are regions of a high n-type impurity concentration, that are formed in the island-like semiconductor layer 107. The LDD region 219 has the same constitution as the LDD region 211. The pixel TFT 204 includes channel-forming to regions 222a, 222b, LDD regions 223a, 223b formed by regions of a low n-type impurity concentration and source or drain regions 225 to 227 formed by regions of a high n-type impurity concentration, that are formed in the island-like semiconductor layer 108. The LDD regions 223a and 223b are constituted in the same manner as the LDD region 211. A storage capacity 205 is formed by the capacitor wiring 123, gate-insulating film, and semiconductor layers 228, 229 connected to the drain region 227 of the pixel TFT 204. In FIG. 3C, the n-channel TFT and the p-channel TFT in the driver circuit have a single-gate structure having a gate electrode between a pair of source and drain, and the pixel TFT has a double-gate structure. These TFTs, however, may be of a single-gate structure or may be of a multi-gate structure in which plural gate electrodes are provided between a pair of source and drain.

In the case of the active matrix-type liquid crystal display device, the first p-channel TFT (A) 200a and the first n-channel TFT (A) 201a are used for forming a shift register circuit, a buffer circuit and a level shifter circuit which place importance on the high-speed operation. In FIG. 3C, these circuits are expressed as logic circuit portions.

Described below are steps for fabricating the active matrix-type liquid crystal display device from the active matrix substrate formed through the above steps. Referring, first, to FIG. 4A, a spacer which is a cylindrical spacer is formed on the active matrix substrate of a state shown in FIG. 3C. The spacer may be formed by sprinkling particles of a size of several microns. Here, however, the spacer is formed by forming a resin film on the whole surface of the substrate followed by patterning. Though not limited to the above material only, the spacer may be formed by, for example, applying NN700 manufactured by JSR Co. by using a spinner and exposing it to light and developing it to form in a predetermined pattern. The spacer is then cured by heating in a clean oven at 150° C. to 200° C. The thus formed spacer can be formed in different shapes by changing the conditions of exposure to light and developing. Desirably, however, the spacer is formed in a cylindrical shape with a flat top portion. When brought into contact with the substrate of the opposing side, then, the spacer works to maintain a mechanical strength needed for the liquid crystal display panel. The shape may be a conical shape, a pyramidal shape or the like shape and there is no particular limitation on the shape. When the spacer is formed in a conical shape, however, the height H may be 1.2 μm to 5 μm, the average radius may be 5 μm to 7 μm, and the ratio of the average radius to the radius of the bottom portion may be 1 to 1.5. In this case, the tapered angle of the side surface is not larger than ±15°.

The arrangement of the spacer may be arbitrarily determined. Desirably, however, the cylindrical spacer 406 is formed being overlapped on a contact portion 231 of the drain wiring 153 (pixel electrode) in the pixel portion so as to cover this portion as shown in FIG. 4A. The contact portion 231 loses the flatness, and the liquid crystals are not favorably oriented in this portion. Therefore, the cylindrical spacer 406 is formed in a manner to fill the contact portion 231 with the spacer resin, thereby to prevent discrimination. Spacers are also formed on the TFTs of the driver circuit. The spacers may be formed over the whole surface of the driver circuit or may be formed to cover the source wirings and the drain wirings as shown in FIG. 4.

Then, a wiring film 407 is formed. Usually, a polyimide resin is used as an alignment film of the liquid crystal display element. After the alignment film is formed, the rubbing is effected so that the liquid crystal molecules are oriented acquiring a predetermined pre-tilted angle. The region that is not rubbed in the rubbing direction is suppressed to be not larger than 2 μm from the end of the cylindrical spacer 406 formed on the pixel portion. The generation of static electricity often becomes a problem in the rubbing. However, the TFTs are protected from the static electricity due to the spacers 405a to 405e formed on the TFTs of the driver circuit. Though not diagramed, the spacers 406, 405a to 405e may be formed after the alignment film 407 is formed.

Figure 4B:
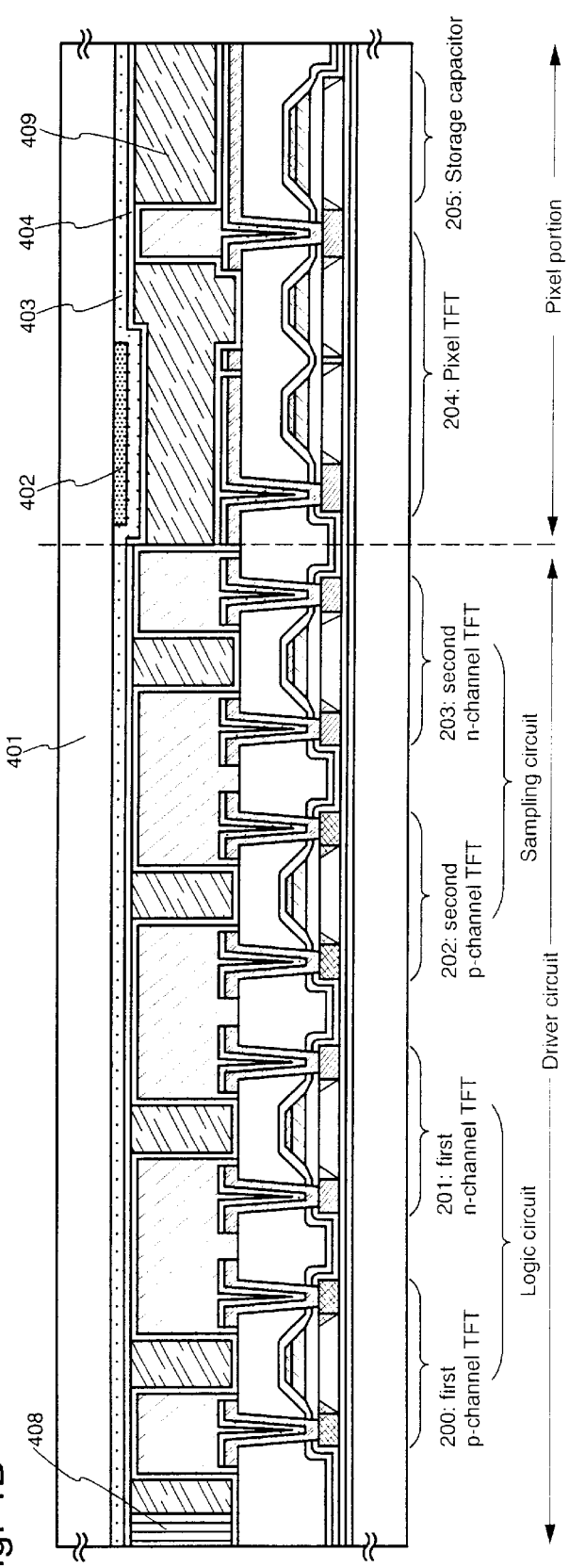

On the opposing substrate 401 of the opposing side are formed a light-shielding film 402, a transparent electrically conductive film 403 and an alignment film 404. The light-shielding film 402 is formed of Ti film, Cr film or Al film maintaining a thickness of 150 nm to 300 nm. The active matrix substrate on which the pixel portion and the driver circuit are formed, is stuck to the opposing substrate with a sealing material 408. The sealing material 408 contains a filler (not shown), and the two pieces of substrates are stuck together maintaining a uniform gap due to the filler and the spacers 406, 405a to 405e. Thereafter, a liquid crystal material 409 is poured into between the two substrates. The liquid crystal material may be a known material. For example, there can be used anti-ferroelectric mixed liquid crystals having no threshold value exhibiting a transmission factor that continuously changes relative to the electric field and exhibiting electro-optical response characteristics, in addition to using TN liquid crystals. Some anti-ferroelectric mixed liquid crystals with no threshold value may exhibit V-shaped electro-optical response characteristics. The active matrix-type liquid crystal display device shown in FIG. 4B is thus completed. The liquid crystal display device of the reflection type is fabricated by using the active matrix substrate that is completed by this embodiment.

Figure 7:
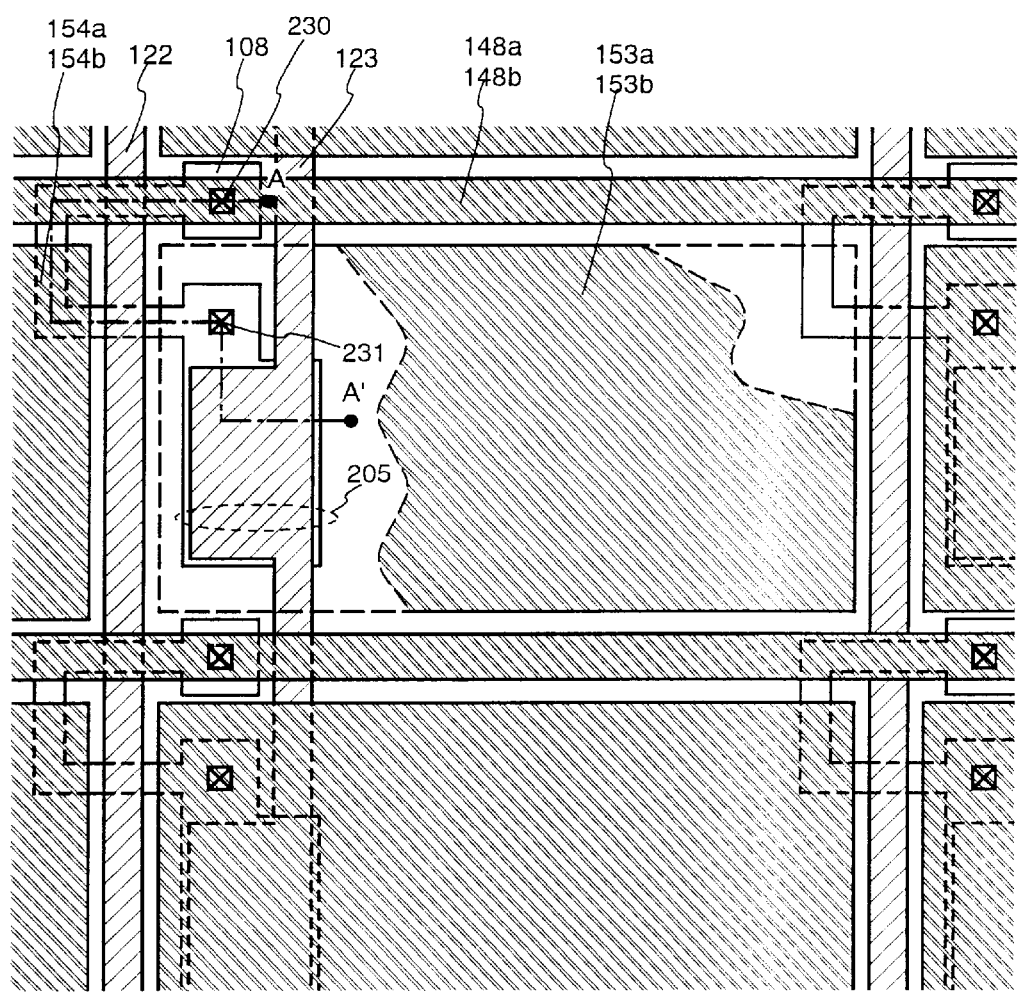
FIG. 7 is a top view illustrating a pixel in a pixel portion.

FIG. 7 is a top view illustrating a pixel of the pixel portion. A cross section A—A shown corresponds to a sectional view of the pixel portion shown in FIG. 3C. In the pixel TFT 204, the gate wiring 122 intersects the underlying island-like semiconductor layer 108 via the gate-insulating film that is not shown, and extends across plural island-like semiconductor layers to also work as a gate wiring. Though not diagramed, on the island-like semiconductor layer are formed a source region, a drain region and LDD regions described with reference to FIG. 3C. Reference numeral 230 denotes a contact portion between the source wiring 148 and the source region 225, and 231 denotes a contact portion between the drain wiring 153 and the drain region 227. The storage capacity 205 is formed by semiconductor layers 228 and 229 extending from the drain region 227 of the pixel TFT 204, and a region on where the capacitor wiring 123 is overlapped via the gate-insulating film. In this constitution, no impurity element is added to the semiconductor layer 228 for controlling valence electrons.

The above constitution helps activate the LDD regions, source region and drain region as a result of forming the gate electrode using an electrically conductive material having heat resistance.

It can further be expected to enhance the effect for relaxing the electric field near the drain region by forming LDD regions that has a gradient in the concentration of the impurity element that is added for controlling the conduction type, the LDD region being partly overlapped on the gate electrode via the gate-insulating film.

[Embodiment 2]

Examples of using heat-resistant conductive materials such as W and Ta as materials for the gate electrode were shown in Embodiment 1. The reason for using these type of materials resides in that it is necessary to activate the impurity element that was doped into the semiconductor layer for the purpose of controlling the conductive type after the formation of the gate electrode by thermal annealing at between 400° C. and 700° C. By implementing this step, it is necessary that the gate electrode have heat-resistivity. However, this type of heat-resistant conductive material has an area resistance of about 10Ω, and hence is not necessarily suitable for a liquid crystal display device having a screen size of a 4-inch class or more. This is because if a gate wiring to be connected to the gate electrode is formed of the same material, then the encircling length in the substrate inevitably becomes large. Thus, the problem of a wiring delay caused by the influence of wiring resistance cannot be ignored.

For example, 480 gate wirings and 640 source wirings are formed when the pixel density is VGA, and 768 gate wirings and 1024 source wirings are formed in the case of XGA. The screen size of the display region becomes 340 mm for a 13-inch class in diagonal length, and becomes 460 mm for an 18-inch class. In this embodiment, as a means of realizing this kind of liquid crystal display device, a method of forming the gate wiring from low-resistant conductive material such as Al and copper (Cu) will be explained.

First, similar to Embodiment 1, the steps shown in FIGS. 1A to 3A will be performed. Then a step of activating the impurity element doped into the respective island-like semiconductor layers is performed for the purpose of controlling the conductive type. In this step, thermal annealing is performed by using an annealing furnace. In addition, laser annealing or rapid thermal annealing (RTA) can also be employed. The thermal annealing process is performed at 400° C. to 700° C., typically 500° C. to 600° C. in a nitrogen atmosphere which has an oxygen concentration of 1 ppm or less, preferably 0.1 ppm or less. For example, heat treatment is performed for 4 hours at 500° C.

In addition, a step of hydrogenating the island-like semiconductor layers is performed by heat treatment at 300 to 450° C. for between 1 and 12 hours in an atmosphere containing between 3 and 100% hydrogen. This step is one for terminating dangling bonds in the semiconductor layers with thermally excited hydrogen. Plasma hydrogenation (using hydrogen excited by a plasma) may be performed as another means of hydrogenation.

After the activation and hydrogenation steps are completed, a gate wiring is formed from a low-resistant conductive material. The low-resistant conductive layer is formed of a conductive layer (D) made from aluminum (Al) or copper (Cu) as its principal constituent. For example, an aluminum film containing between 0.1 and 2% by weight of titanium (Ti) is formed as the conductive layer (D) on the entire surface (not shown). The conductive layer (D) may be formed with a thickness of 200 to 400 nm (preferably 250 to 350 nm). Then using a photomask to form a predetermined resist pattern, the conductive layer is etched in order to form gate wiring and a capacitor wiring. Then removing the conductive layer (D) by wet etching using a phosphoric acid-based etching solution, the gate wiring can be formed while maintaining the selective workability with the base. A first interlayer insulating film is formed in the same way as that of Embodiment 1.

Thereafter, similar to Embodiment 1, by forming the second interlayer insulating film 147 made of an organic insulating material, source wiring, drain wirings and the active matrix substrate can thus be completed.

By forming the gate wiring from a low-resistant conductive material in this way, the wiring resistance can be sufficiently reduced. Accordingly, the pixel portion (screen size) can be applied to a display device that is in 4-inch class or more.

[Embodiment 3]

The active matrix substrate manufactured in Embodiment 1 is applicable for a reflector type liquid crystal display device as is. On the other hand, in the case of applying it to a transmission type liquid crystal display device, then it is appropriate to form the pixel electrodes provided in each pixel of the pixel portion with transparent electrodes. A method of manufacturing an active matrix substrate corresponding to the transmission type liquid crystal display device is explained in Embodiment 3 with references to FIGS. 6A to 6D.

Figure 6A:
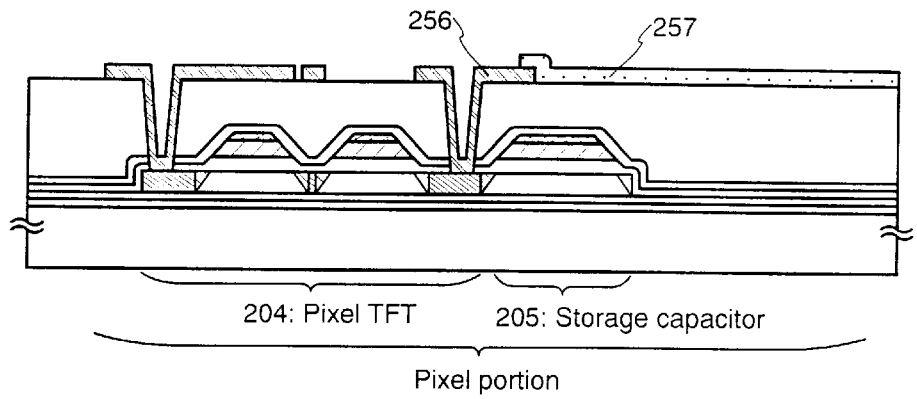
FIGS. 6A to 6D are sectional views illustrating the constitution of a pixel TFT.
Figure 6B:
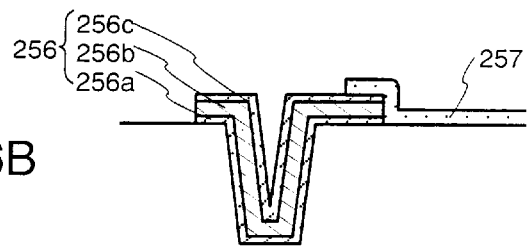

The active matrix substrate is manufactured in the same way as Embodiment 1. In FIG. 6A, a conductive metallic film is formed by sputtering or vacuum evaporation to form a source wiring and a drain wiring. This structure will be explained in detail with reference to FIG. 6B using the drain wiring 256 as an example. A Ti film 256*a* is formed at a thickness of between 50 and 150 nm, and then a contact hole and a semiconductor film that forms the source or the drain region of an island-like semiconductor layer are then formed. Next an aluminum (Al) film 256*b* is formed at a thickness of between 300 and 400 nm overlapping on the Ti film 256*a*. Further, a Ti film 256*c* or a titanium nitride (TiN) film is formed at a thickness of between 100 and 200 nm to thereby form a three-layer structure. Then a transparent conductive film is formed on the entire surface. A pixel electrode 257 is formed by a patterning process, using a photomask, and an etching process. The pixel electrode 257 is formed on a second interlayer insulating film made of an organic resin material and sets aside a portion for overlapping with the drain wiring 256 of the pixel TFT 204 in order to form an electrical connection.

Figure 6C:
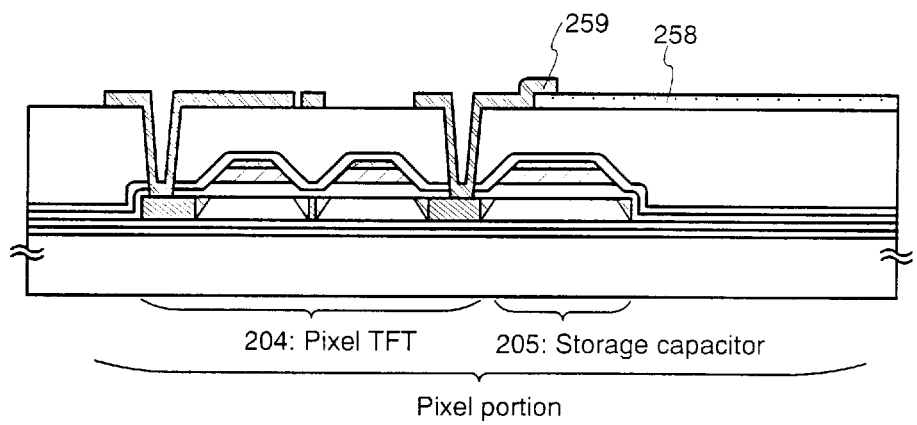
Figure 6D:
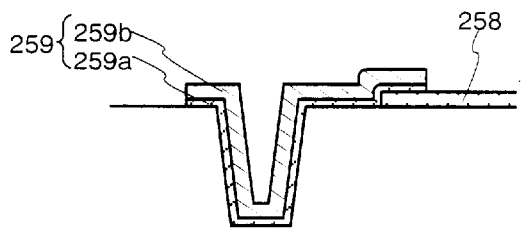

FIG. 6C is an example of forming a drain wiring by first forming a transparent conductive film on the second interlayer insulating film 143. Then after performing a patterning process and an etching process to form a pixel electrode 258,*a* portion that overlaps with the pixel electrode 258 is provided to form a drain wiring 259. As shown in FIG. 6D, the drain wiring 259 is provided by forming a Ti film 259*a* at a thickness of between 50 and 150 nm, forming a contact hole and a semiconductor film that forms the source or the drain region of an island-like semiconductor layer, and then forming an aluminum film 259*b* at a thickness of between 300 and 400 nm overlapping on the Ti film 259*a*. With this structure, the pixel electrode 258 is in contact with only the Ti film 259*a* that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$:ITO) formed by utilizing the sputtering method and the vacuum evaporation method may be used as materials for the transparent conductive film. The etching treatment of this type of material is performed with hydrochloric acid solutions. However, in particular, the etching of ITO readily generates residues. Therefore, an indium oxide/zinc oxide alloy ($In_2O_3$—ZnO) may be used in order to improve the etching processability. The indium oxide/zinc oxide alloy has excellent flat and smooth surface properties, and also has excellent thermal stability in regards to ITO. Accordingly, in the structure of FIGS. 6A and 6B, at an edge surface of a drain wiring 256 where the Al film 256*b* comes into contact with the pixel electrode 257, corrosion reaction with Al can be prevented. Similarly, zinc oxide (ZnO) is also a suitable material. In order to further improve the transmissivity of visible light and conductivity, zinc oxide doped with gallium (Ga) (ZnO:G), etc. may be used.

In Embodiment 1, an active matrix substrate that can be used for manufacturing the reflection type liquid crystal display device was fabricated by using 5 photomasks. The addition of one more photomask (a total of 6 photomasks) can thus complete an active matrix substrate corresponding to the transmission type liquid crystal display device. Though the steps of described in this embodiment are similar to those in Embodiment 1, this kind of structure can be applied to the active matrix substrate shown in Embodiment 2.

[Embodiment 4]

Another method of manufacturing a crystalline semiconductor layer that forms an active layer of a TFT of the active matrix substrate indicated in Embodiment 1 to Embodiment 3 is shown here in Embodiment 4. A crystalline semiconductor layer is formed from an amorphous semiconductor layer which is crystallized by thermal annealing, laser annealing, or rapid thermal annealing (RTA). Another crystallization method disclosed in Japanese Patent Application Laid-open No. Hei 7-130652 in which a catalytic element is used can also be applied. An example of this case is explained with references to FIGS. 8A to 8C.

Figure 8A:
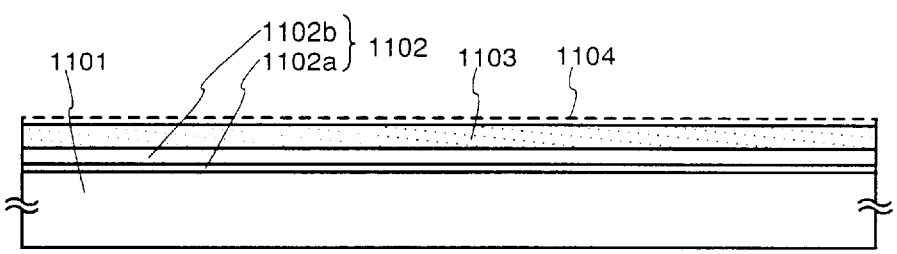
FIGS. 8A to 8C are sectional views illustrating steps of fabricating a crystalline semiconductor layer.

As shown in FIG. 8A, base films 1102*a* and 1102*b* and a semiconductor layer 1103 having an amorphous structure formed at a thickness of between 25 to 80 nm are formed on a glass substrate 1101, similar to Embodiment 1. An amorphous silicon (a-Si) film, an amorphous silicon germanium (a-SiGe) film, an amorphous silicon carbide (a-SiC) film, an amorphous silicon tin (a-SiSn) film, etc. are applicable for the amorphous semiconductor layer. It is appropriate to form these amorphous semiconductor layers to contain hydrogen at about 0.1 to 40 atomic %. For example, a 55 nm thick amorphous silicon film is formed. An aqueous solution containing 10 ppm by weight conversion of a catalytic element is then applied by spin coating in which application is performed by rotating the substrate with a spinner, forming a layer 1104 containing the catalytic element. Catalytic elements include nickel (Ni), germanium (Ge), iron (Fe), palladium (Pd), tin (Sn), lead (Pb), cobalt (Co), platinum (Pt), copper (Cu), gold (Au), and the like. Other than spin coating, the catalytic element containing layer 1104 may also be made by forming a 1 to 5 nm thick layer of the above catalytic elements by the printing method, the spray method, and the bar coater method, or the sputtering method or the vacuum evaporation method.

Figure 8B:
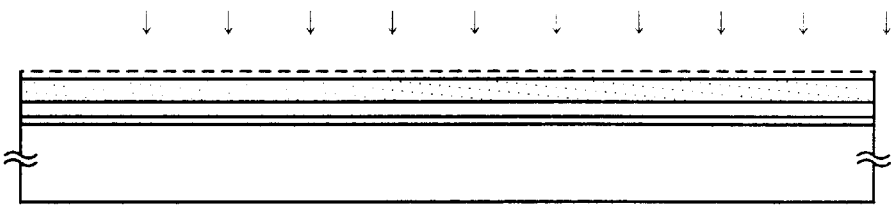

In the crystallization step shown in FIG. 8B, heat treatment is first performed for approximately 1 hour at between 400° C. and 500° C., making the amount of hydrogen contained in the amorphous silicon film 5 atomic % or less. If the initial amount of hydrogen contained in the amorphous silicon film after film deposition is this value, then in this case, heat treatment need not be necessarily performed. Thermal annealing is then performed in a nitrogen atmosphere at 550° C. to 600° C. for between 1 and 8 hours using an annealing furnace. A crystalline semiconductor layer 1105 made from the crystalline layer. However, if the crystalline semiconductor layer 1105, manufactured by this thermal annealing, is observed microscopically using an optical microscope, it is discerned that amorphous region remains locally. In this case, from observation of spectrum using a Raman spectroscopy, an amorphous constituent observed at 480 cm$^{-1}$ has a broad peak. Therefore, after thermal annealing, treating the crystalline semiconductor layer 1105 with the laser annealing method explained in Embodiment 1 is an effective means applicable for enhancing the crystallinity of the crystalline semiconductor film.

Figure 9A:
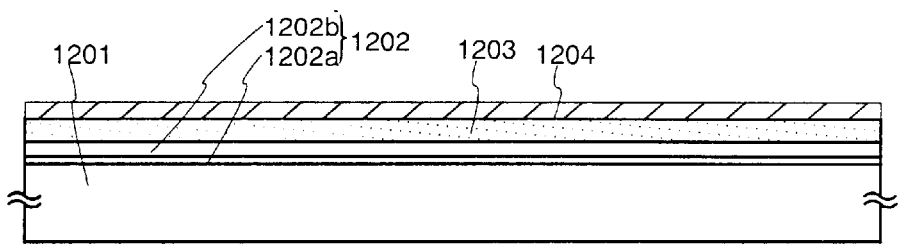
FIGS. 9A to 9C are sectional views illustrating steps of fabricating a crystalline semiconductor layer.
Figure 9B:
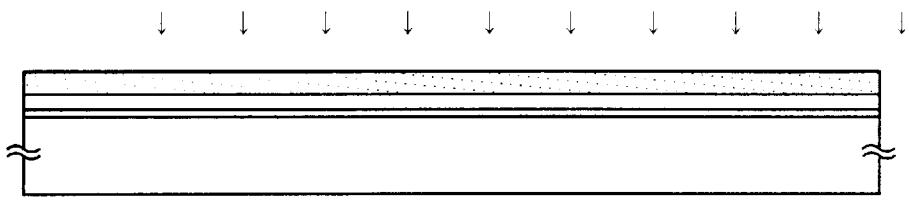
Figure 9C:
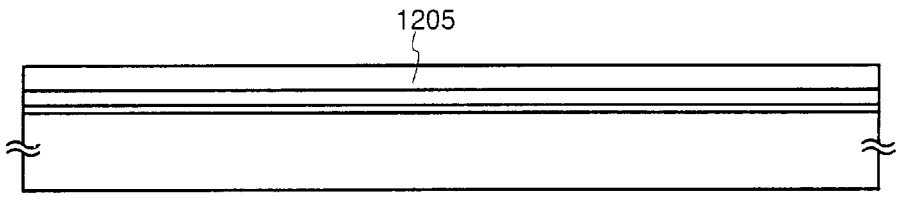

Similarly, FIGS. 9A to 9C also show an example of a crystallization method using a catalytic element in which a layer containing a catalytic element is formed by sputtering. First, base films 1202a and 1202b and a semiconductor layer 1203 having an amorphous structure formed at a thickness of between 25 to 80 nm are formed on a glass substrate 1201, similar to Embodiment 1. Then about a 0.5 to 5 nm thick oxide film is formed on the surface of the semiconductor layer 1203 having an amorphous structure layer (not shown in the Figure). As an oxide film with this kind of thickness, an appropriate coating may be actively formed by plasma CVD or sputtering, but the oxide film may also be formed by exposing the surface of the semiconductor layer 1203 having an amorphous structure to an oxygen atmosphere in which the substrate has been heated at 100° C. to 300° C. and plasma treated, or exposing the surface of the semiconductor layer 1203 having an amorphous structure to a solution containing hydrogen peroxide ($H_2O_2$). The oxide film may also be formed by irradiating infrared light into an atmosphere containing oxygen to generate ozone and then exposing the semiconductor layer 1203 having an amorphous structure to the ozone atmosphere.

In this way, a layer 1204 containing the above catalytic element is formed, by sputtering, on the semiconductor layer 1203 having an amorphous structure with a thin oxide film on its surface. No limitations are placed on the thickness of this layer, but it is appropriate to form this layer at about 10 to 100 nm. For example, an effective method is to form an Ni film with Ni as the target. In the sputtering method, a portion of a high-energy particle made from the above catalytic element is accelerated in the electric field and comes flying to the substrate side and is driven into the close vicinity of the surface of the semiconductor layer 1203 having an amorphous structure or into the oxide film which is formed on the surface of the semiconductor. However the ratio of the catalytic element driven thereinto is different according to the condition of plasma generation and the bias state of the substrate. The amount of catalytic element in the close vicinity of the surface of the semiconductor layer 1203 having an amorphous structure should be preferably between $1\times10^{11}$ and $1\times10^{14}$ atoms/cm$^2$.

Figure 8C:
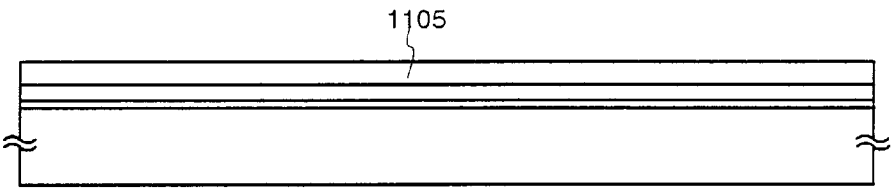

Thereafter, the layer 1204 is selectively removed. For example, it is possible to remove this layer by a solution such as nitric acid in case this layer is formed by Ni film, or it is possible to remove Ni film and an oxide film which is formed on an amorphous semiconductor film 1203 simultaneously if a solution containing hydrofluoric acid. In any way, the amount of catalytic element in the close vicinity of the surface of the semiconductor layer 1203 having an amorphous structure should be preferably between $1\times10^{11}$ and $1\times10^{14}$ atoms/cm$^2$. Then, as shown in FIG. 9B a crystalline semiconductor layer 1205 can be obtained by thermal annealing similarly to FIG. 8B (FIG. 8C).

By forming the island-like semiconductor layers 104 to 108 from the crystalline semiconductor layers 1105 and 1205 manufactured in FIGS. 8A to 8C or FIGS. 9A to 9C., an active matrix substrate can be completed, similarly to Embodiment 1. However, in crystallization process, if a catalytic element for promoting the crystallization of silicon is used, a small amount (about $1\times10^{17}$ to $1\ 10^{19}$ atoms/cm$^3$) of the catalytic element remains within the island-like semiconductor layers. It is, of course, possible to complete the TFT in such a state, but it is preferred to remove the remaining catalytic element from at least the channel forming region. One of the means of removing this catalytic element is a means using gettering action of phosphorus (P).

The gettering treatment with phosphorus (P) used in this purpose may be performed together with the activation step explained in FIG. 3B. This state is explained with reference to FIG. 10. Detailed explanation is omitted here because FIG. 10A is the same as the step of FIG. 2D and FIG. 10B is the same as that of FIG. 3A of embodiment 1. The concentration of phosphorus (P) necessary for gettering may be on a similar order as the impurity concentration of high concentration n-type impurity regions, and the catalytic element can be segregated at this concentration from the channel forming regions of the n-channel TFT and the p-channel TFT, into the phosphorous (P) contained impurity regions, by the thermal annealing at the activation step. (The direction indicated by an arrow in FIG. 10C.) As a result, the catalytic element is segregated into the impurity regions at a concentration of about $1\times10^{17}$ to $1\times10^{19}$ atoms/cm$^3$.

Next, first interlayer insulating film is formed by the way which is the same as the embodiment 1. (FIG. 10D)

An active matrix substrate can be attained by the rest of the steps which is according to embodiment 1. A TFT with good characteristics can be attained because the off current value of a TFT manufactured in this way is reduced, and high electric field mobility is attained due to good crystallinity.

[Embodiment 5]

In this example, the active matrix substrate is obtained through the steps conducted according to an order different from that of the embodiment 4.

First, a state shown in FIG. 10A is obtained according to the embodiments 1 and 4.

The steps are the same as those of FIG. 11A and FIG. 10A are denoted by the same symbols.

Then, after the resist mask is removed, heat treatment is executed at 500° C. to 600° C. for 1 to 10 hours. Due to this heat treatment, the catalytic element is segregated at that concentration from the channel-forming regions of the n-channel TFTs and the p-channel TFTs into the impurity region containing phosphorus (P)(direction of an arrow in FIG. 11B). The impurity element is activated simultaneously with the gettering. An increased effect is obtained if the gettering is effected in this step (prior to adding boron element).

Then, resist masks 701, 702 and 703 are formed, and boron element is added (FIG. 11C). Thereafter, heat treatment is effected to activate boron and, then, a first interlayer-insulating film 704 is formed (FIG. 11D).

Through the subsequent steps same as those of the embodiment 1, the active matrix substrate is obtained. Further, this embodiment can be freely combined with any of embodiments 1 to 5.

[Embodiment 6]

In this embodiment, the active matrix substrate is obtained through the steps conducted according to an order different from that of the embodiment 4.

Figure 12A:
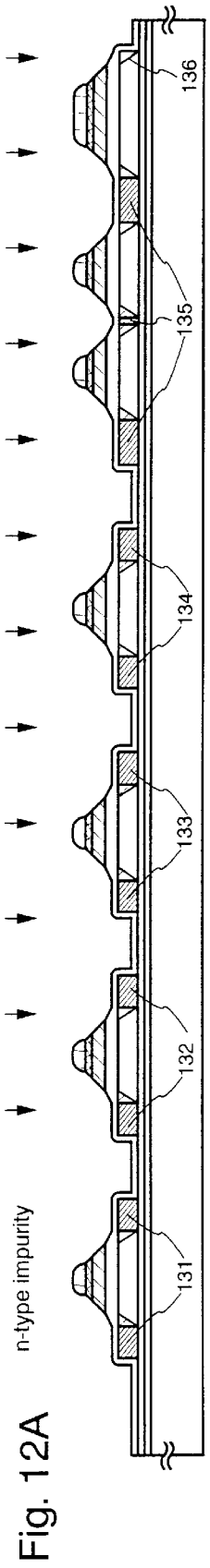
FIGS. 12A to 12D are sectional views illustrating steps of fabricating pixel TFTs and TFTs in the driver circuit.
Figure 12B:
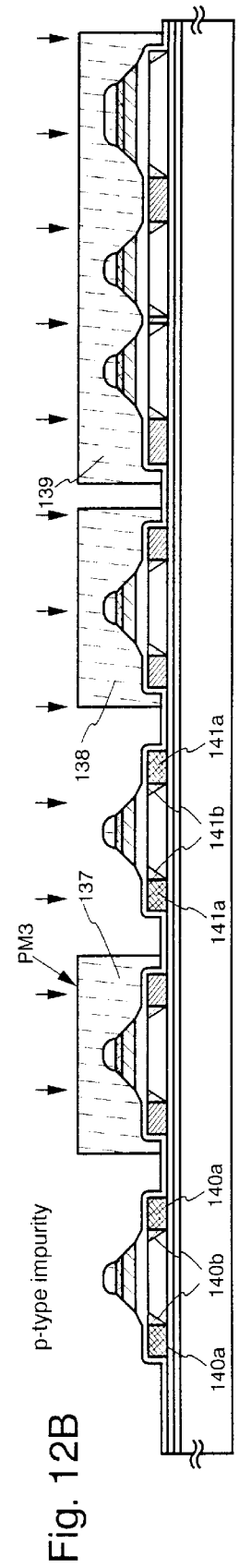

First, the state shown in FIG. 10A is obtained according to the embodiments 1 and 4 and, then, a state of FIG. 10B is obtained. This corresponds to FIGS. 12A and 12B. The steps are the same as those of FIG. 10A and FIG. 10B are denoted by the same symbols.

Figure 12C:
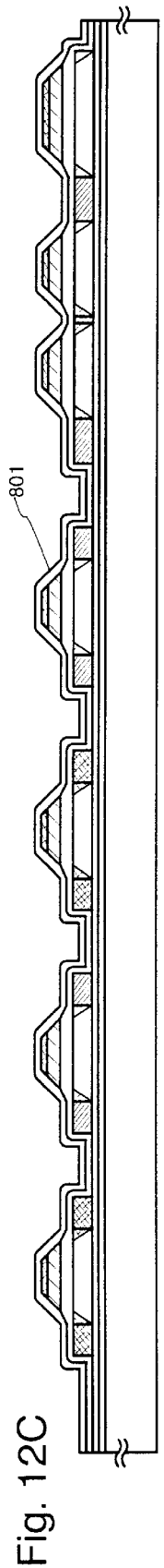

Then, a first interlayer-insulating film 801 is formed (FIG. 12C).

Figure 12D:
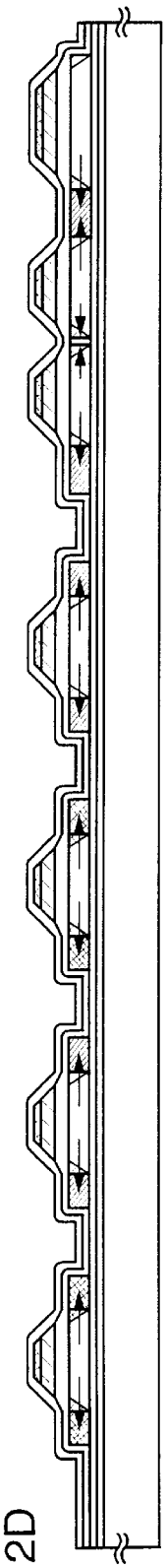

Next, the heat treatment is effected at 500° C. to 600° C. for 1 to 10 hours. Due to this heat treatment, the catalytic element is segregated at that concentration from the channel-forming regions of the n-channel TFTs and the p-channel TFTs into the impurity region containing phosphorus (P) (direction of an arrow in FIG. 12D). The impurity element is activated simultaneously with the gettering.

Through the subsequent steps same as those of the embodiment 1, the active matrix substrate is obtained. Further, this embodiment can be freely combined with any of the embodiments 1 to 5.

[Embodiment 7]

This embodiment is concerned with the constitution of an active matrix-type liquid crystal display device obtained through the embodiment 1, as described below with reference to FIGS. 13 and 14.

Figure 13:
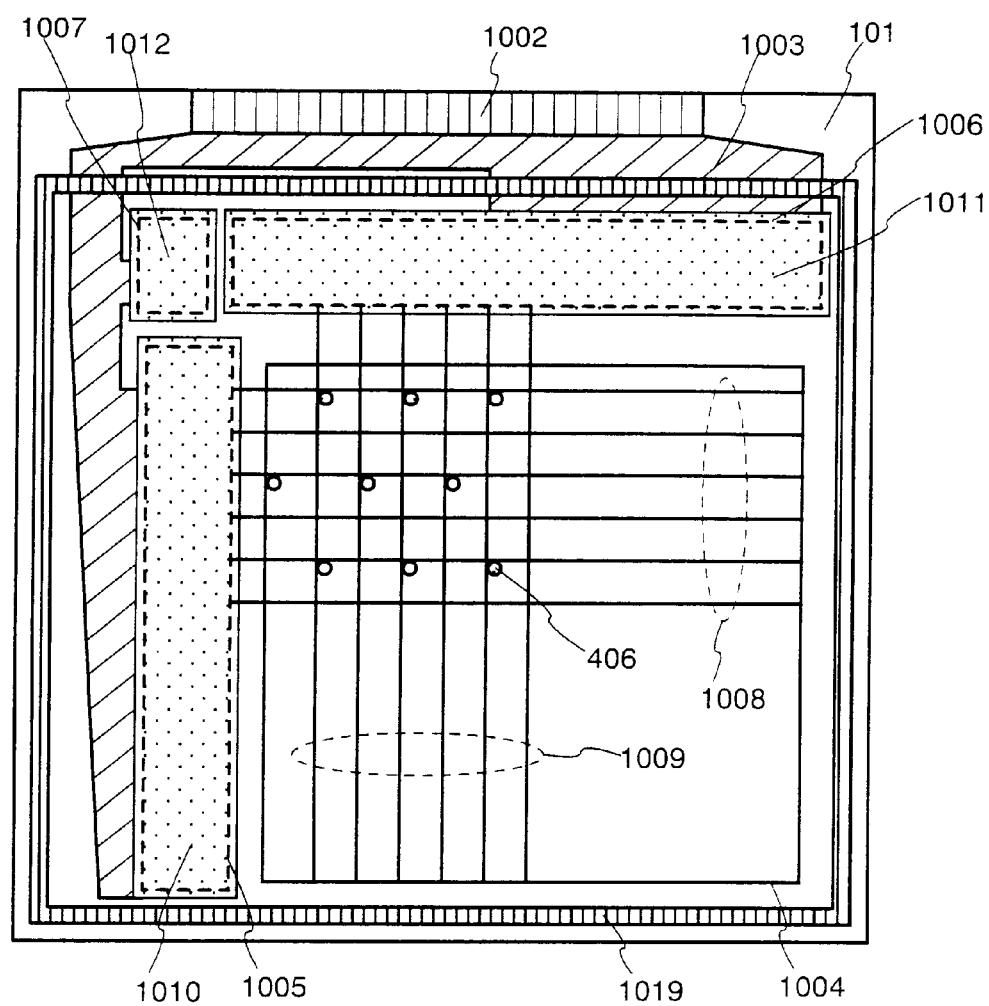
FIG. 13 is a top view illustrating the arrangement of input/output terminals, wirings, circuits, spacers and sealing material of a liquid crystal display device.
Figure 14:
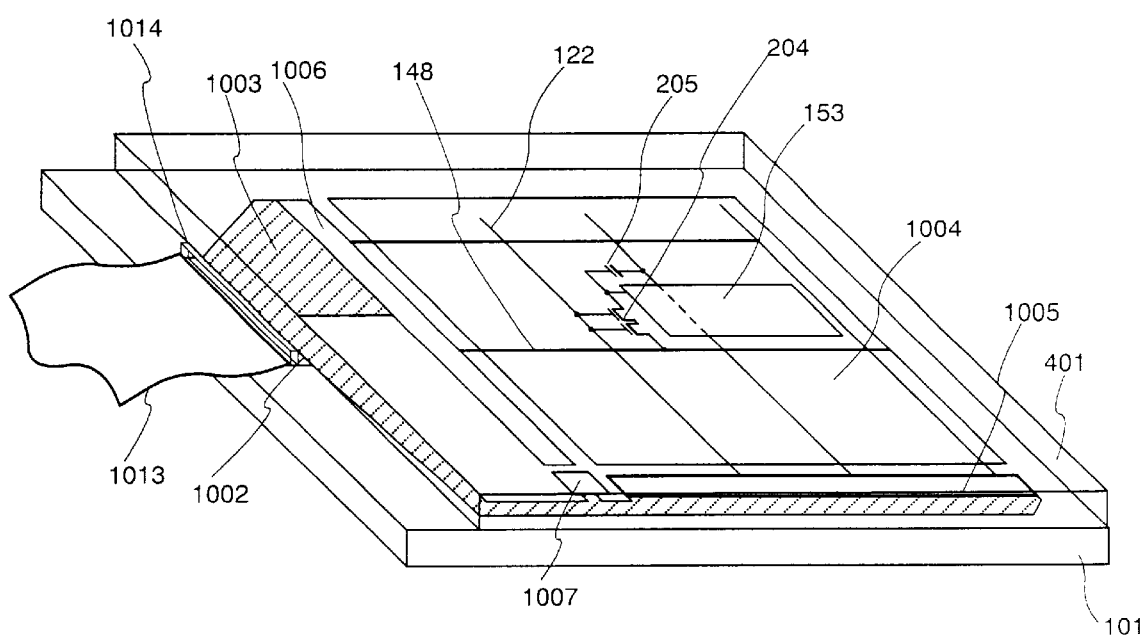
FIG. 14 is a perspective view illustrating the structure of the liquid crystal display device.

FIG. 13 is a top view of the active matrix substrate and illustrates a positional relationship among the pixel portion, driver circuit, spacer and sealing material. On a glass substrate 101 mentioned in the embodiment 1 are provided a scanning signal driver circuit 1005 and a picture signal driver circuit 1006 which are driver circuits around the pixel portion 1004. There may be further added other CPU or a signal processing circuit 1007 such as memory. These driver circuits are connected to external input/output terminals 1002 through the connection wiring 1003. On the pixel portion 1004, a group of gate wirings 1008 extending from the scanning signal driver circuit 1005 and a group of source wirings 1009 extending from the picture signal driver circuit 1006 are intersecting like a matrix to form pixels, each pixel having the pixel TFT 204 (not shown) and the storage capacity 205 (not shown).

The cylindrical spacers 406 may be provided for all pixels in the pixel portion in FIG. 4, but may be provided for every other several to several tends of pixels arranged in the form of a matrix as shown in FIG. 13. That is, the rate of the number of the spacers may be 20% to 100% for the whole number of the pixels constituting the pixel portion. Further, the spacers 405a to 405e in the driver circuit may cover the whole surface, or may be provided at the positions of the source and drain wirings of the TFTs. In FIG. 13, the positions of the spacers provided in the driver circuit are denoted by 1010 to 1012. The sealing material 1019 shown in FIG. 13 is formed on the outside of the pixel portion 1004, scanning signal driver circuit 1005, picture signal driver circuit 606 and other signal processing circuit 1007 but on the inside of the external input/output terminals 1002 on the substrate 101.

The constitution of the active matrix-type liquid crystal display device will now be described with reference to a perspective view of FIG. 14. In FIG. 14, the active matrix substrate is constituted by the pixel portion 1004, scanning signal driver circuit 1005, picture signal driver circuit 1006 and other signal processing circuit 1007 formed on the glass substrate 101. The pixel portion 1004 includes the pixel TFT 204 and the storage capacity 205, and the driver circuit formed in the periphery of the pixel portion is constituted based on a CMOS circuit. The gate wirings 122 and the source wirings 148 extend from the scanning signal driver circuit 105 and the picture signal driver circuit 1006 on the pixel portion 1004, and are connected to the pixel TFT 204. Further, a flexible printed circuit board (FPC) 1013 is connected to the external input terminals 1002 to input picture signals. The FPC 1013 is firmly adhered with a reinforcing resin 1014 and are connected to the driver circuits through connection wirings 1003. The opposing substrate 401 is provided with a light-shielding film and transparent electrodes that are not shown.

The above liquid crystal display device can be formed by using the active matrix substrate illustrated in the embodiments 1 to 6. Use of the active matrix substrate of FIG. 1 makes it possible to obtain a reflection-type liquid crystal display device and use of the active matrix substrate shown in FIG. 3 makes it possible to obtain a transmission-type liquid crystal display device.

[Embodiment 8]

Figure 15:
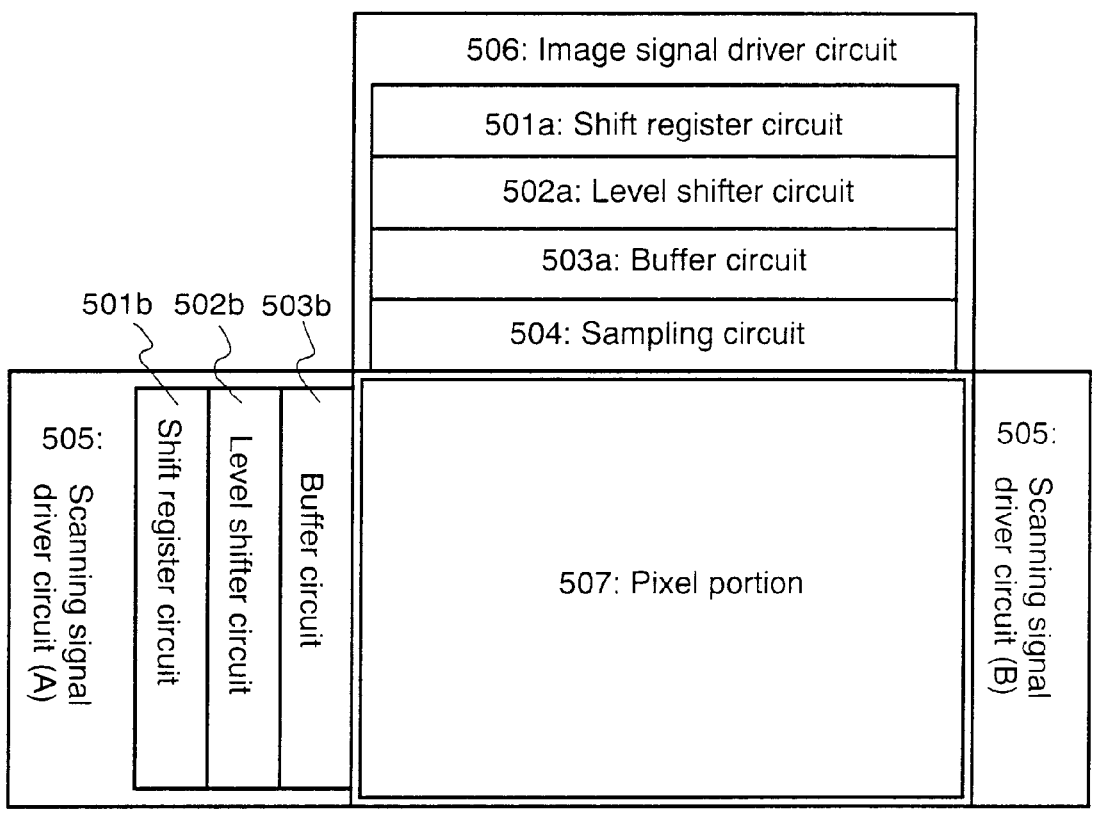
FIG. 15 is a block diagram illustrating the circuit constitution of the liquid crystal display device.
Figure 16A:
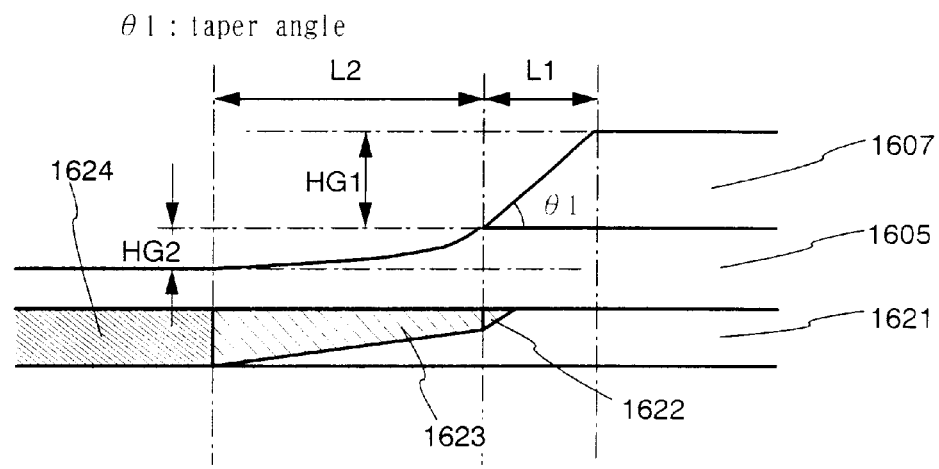
FIGS. 16A and 16B are diagrams illustrating the constitution of the LDD region.
Figure 16B:
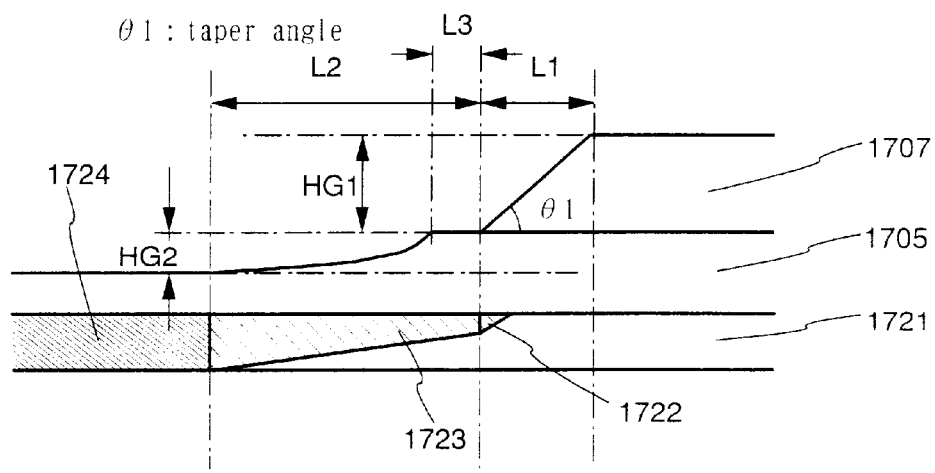
Figure 17A:
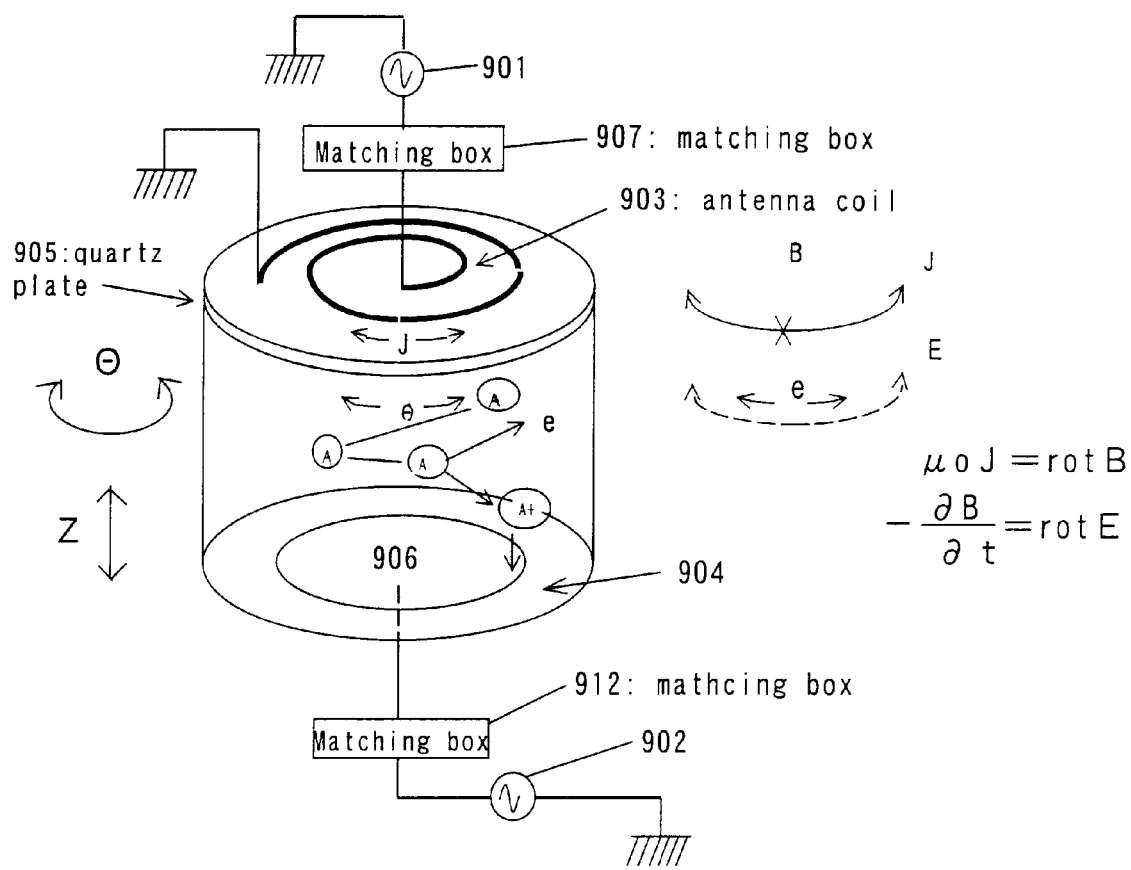
FIGS. 17A and 17B are diagrams illustrating the principle of ICP.
Figure 17B:
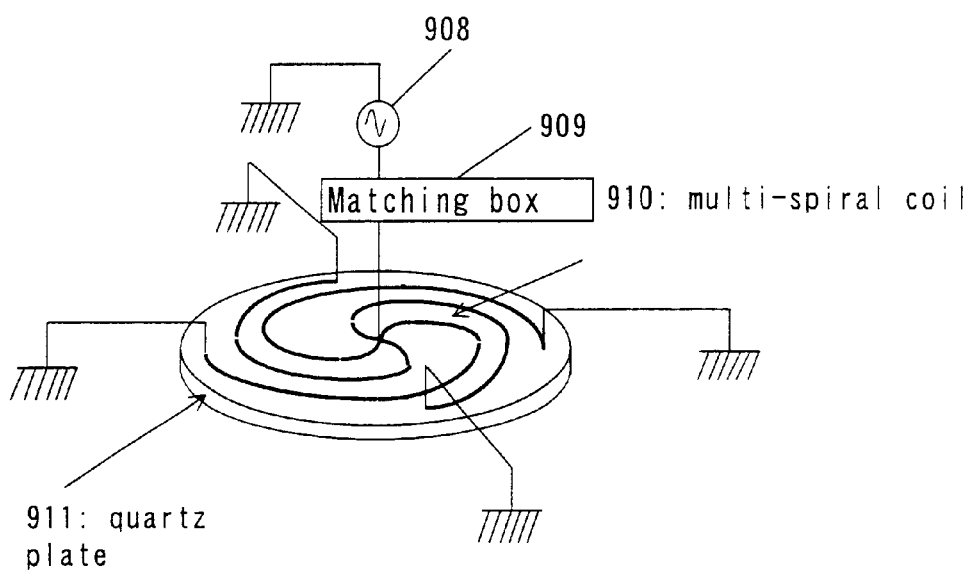
Figure 18A:
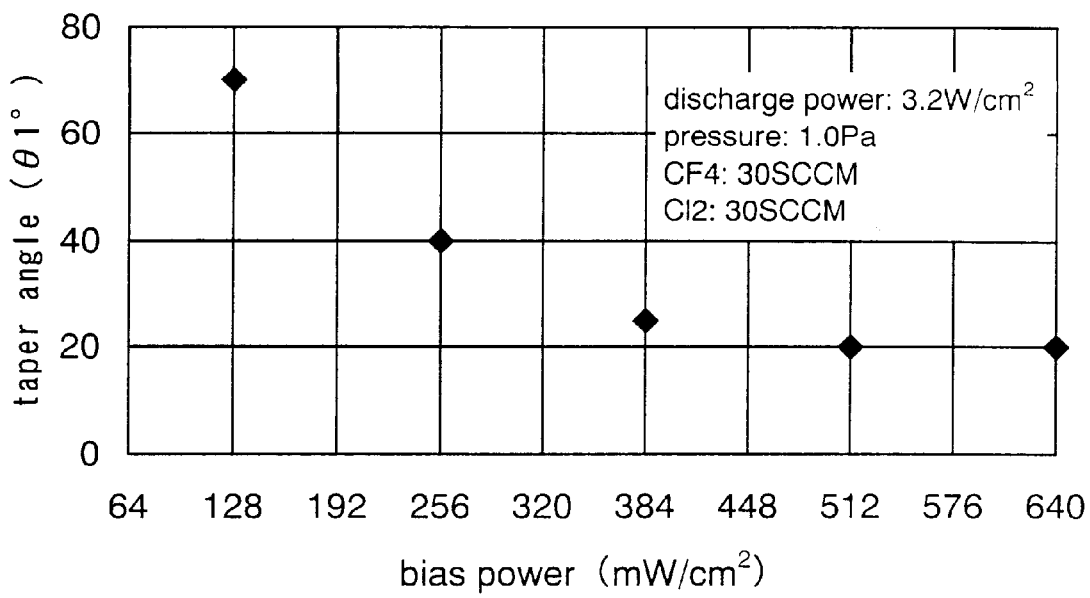
FIGS. 18A and 18B are graphs illustrating a relationship between the angle of the tapered portion at an end of the W film forming a pattern and the etching conditions.
Figure 18B:
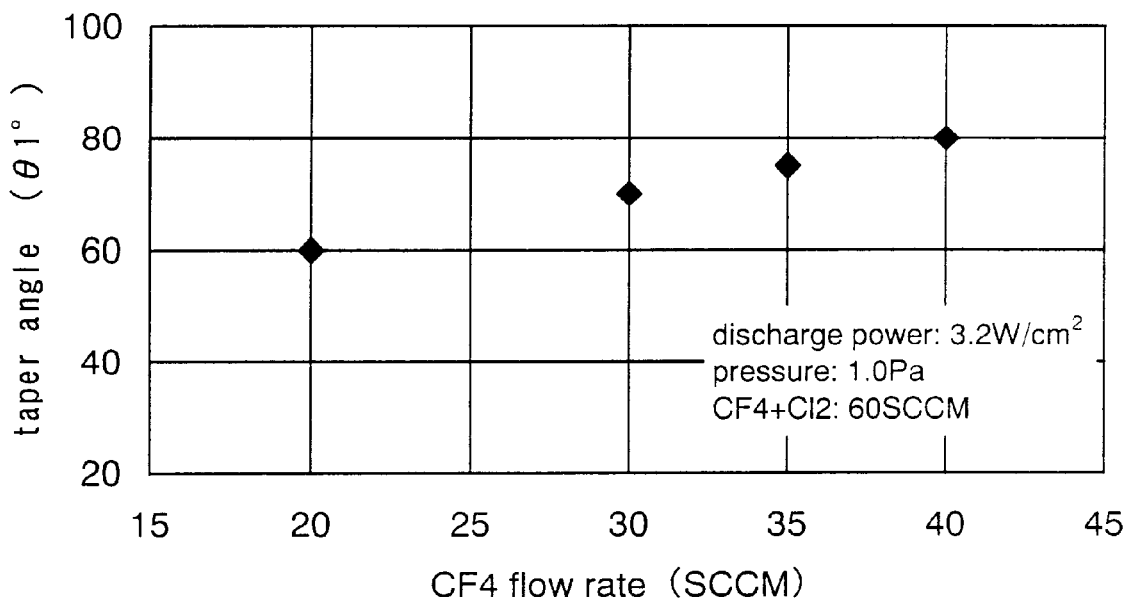

FIG. 15 illustrates an example of the circuit structure of the active matrix substrate described in Embodiments 1 to 6, and shows the circuit structure of a direct-view type display device. This active matrix substrate is composed of the image signal driver circuit 506, the scanning signal driver circuits (A) and (B) 505, and the pixel portion 507. Note that the driver circuit stated throughout the present specification is a generic term including the image signal driver circuit 506 and the scanning signal driver circuits 505.

The image signal driver circuit 506 comprises a shift register circuit 501a, a level shifter circuit 502a, a buffer circuit 503a, and a sampling circuit 504. In addition, the scanning signal driver circuits (A) and (B) 505 comprises of a shift register circuit 501b, a level shifter circuit 502b, and a buffer circuit 503b.

The driving voltages of the shift register circuits 501a and 501b are between 5 and 16V (typically 10V). A TFT of a CMOS circuit for forming this circuit is formed of the first p-channel TFT (A) 200a and the first n-channel TFT (A) 201a of FIG. 3C. In addition, since the driving voltage of the level shifter circuits 502a and 502b and the buffer circuits 503a and 503b become as high as 14 to 16V, it is preferable that the TFT structure be formed into a multi-gate structure. Forming the TFT into a multi-gate structure is effective in raising voltage-resistance and improving the reliability of the circuits.

The sampling circuit 504 comprises an analog switch and its driving voltage is between 14 to 16V. Since the polarity alternately reverses to be driven and there is a necessity to reduce the off current value, it is desired that the sampling circuit 504 be formed of the second p-channel TFT (A) 202*a* and the second n-channel TFT (A) 203*a* as shown in FIG. 3C. Further, the driving voltage of the pixel portion is between 14 and 16 V. From a viewpoint of reducing power consumption, there is a demand to further reduce the off current value than that of the sampling circuit. Accordingly, as a basic structure, the pixel portion is formed into a multi-gate structure as the pixel TFT 204 shown in FIG. 3C.

Note that the structure of this Embodiment can be readily realized by manufacturing the TFT in accordance with the steps shown in Embodiments 1 through 6. The structures of the pixel portion and the driver circuits only are shown in this embodiment. Other circuits such as a signal divider circuit, a frequency dividing circuit, a D/A converter, a γ correction circuit, an op-amp circuit, and further signal processing circuits such as a memory circuit and an arithmetic operation circuit, and still further a logic circuit, may all be formed on the same substrate in accordance with the processes of Embodiments 1 through 6. According to the present invention, a semiconductor device having the pixel portion and the driver circuits formed on the same substrate, for example, a liquid crystal display device provided with the signal driver circuit and the pixel portion can be realized.

[Embodiment 9]

An active matrix substrate and a liquid crystal display device manufactured by implementing the present invention can be used in various electro-optical devices. The present invention can then be applied to all electronic equipment that incorporates this kind of electro-optical device as a display medium. The following can be given as this type of electronic equipment: a personal computer; a digital camera; a video camera; a portable information terminal (such as a mobile computer, a portable telephone, and an electronic book); and a navigation system.

Figure 19A:
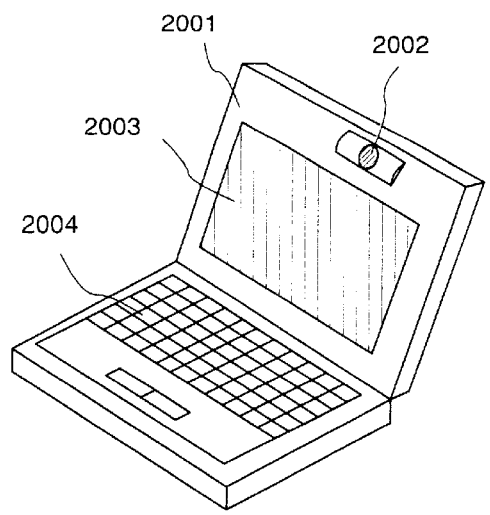
FIGS. 19A to 19E are views illustrating examples of semiconductor devices.

FIG. 19A shows a personal computer comprising a main body 2001 provided with a microprocessor, a memory and the like, an image inputting unit 2002, a display device 2003, and a key board 2004. The present invention may form the display device 2003 and other driving circuits.

Figure 19B:
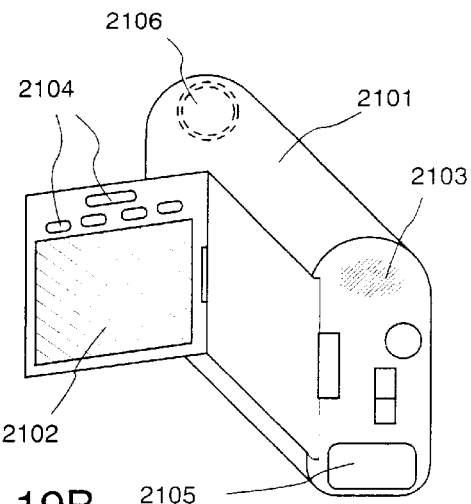

FIG. 19B shows a video camera, which is composed of a main body 2101, a display device 2102, an audio input unit 2103, operation switches 2104, a battery 2105, and an image receiving unit 2106. The present invention can be applied to the display device 2102 and to other driving circuits.

Figure 19C:
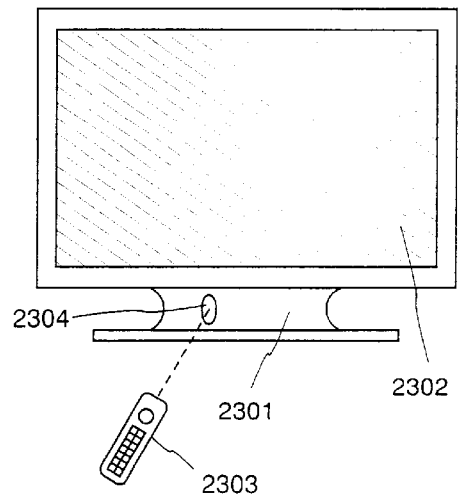

FIG. 19C shows a television which is composed of: a main body 2301: a controller 2303; and a display device 2302 built into the main body 2301. Further in order for the main body 2301, the controller 2303, and the display device 2302 to transmit signals to each other, wired communication may be used, or sensor units 2304 can be provided for either wireless communication or optical communication. The present invention can be applied to the display device 2302.

Figure 19D:
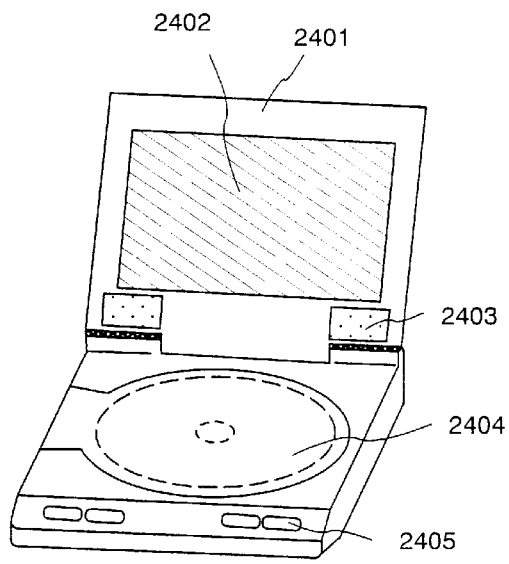

FIG. 19D shows a player which uses a recording medium with a program recorded therein (hereafter referred to as a recording medium), and which is composed of a main body 2401, a display device 2402, speaker units 2403, a recording medium 2404, and operation switches 2405. Note that a DVD (Digital Versatile Disk), or Compact Disk (CD) is used as the recording medium for this device, and that the device is capable of reproduction of a music program, display of an image, and information display through video games (or television games) and through the Internet. The present invention can be suitably used for the display device 2402 and other driving circuits.

Figure 19E:
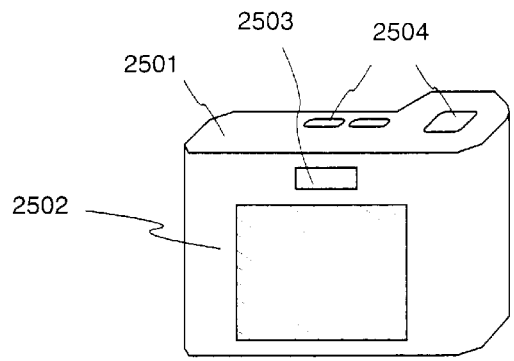

FIG. 19E shows a digital camera, which is composed of a main body 2501, a display device 2502, an eye piece portion 2503, operation switches 2504, and an image receiving unit (not shown in the figure). The present invention can be applied to the display device 2502 and to other driving circuits.

FIG. 20A shows a front type projector, which is composed of an optical light source system and display device 2601, and a screen 2602. The present invention can be applied to the display device, and to other signal control circuits. FIG. 20B shows a rear type projector, which is composed of a main body 2701, an optical light source system and display device 2702, a mirror 2703, and a screen 2704. The present invention can be applied to the display device, and to other driving circuits.

FIG. 20C is a drawing showing an example of the structure of the optical light source system and the display devices 2601 and 2702 in FIGS. 20A and 20B. The optical light source system and display devices 2601 and 2702 each consist of an optical light source system 2801, mirrors 2802 and 2804 to 2806, dichroic mirrors 2803, a beam splitter 2807, liquid crystal display devices 2808, phase difference plates 2809, and an optical projection system 2810. The optical projection system 2810 is composed of a plural number of optical lenses. In FIG. 20C an example of a three plate system is shown in which three liquid crystal display devices 2808 are used, but there are no special limitations and an optical system of single plate system is acceptable, for example. Further, the operator may suitably set optical lenses, polarizing film, film to regulate the phase, IR films, etc., within the optical path shown by the arrows in FIG. 20C. In addition, FIG. 20D shows an example of the structure of the optical light source system 2801 of FIG. 20C. In this embodiment, the optical light source system 2801 is composed of a reflector 2811, a light source 2812, lens arrays 2813 and 2814, a polarization conversion element 2815, and a condenser lens 2816. Note that the optical light source system shown in FIG. 20D is an example, and it is not limited to the structure shown in the figure.

Further, although not shown in the figures, it is also possible to apply the present invention to, for example, a read-in circuit of a navigation system or an image sensor. Thus the application range for the present invention is extremely wide, and it can be applied to electronic equipment in all fields. Further, the electronic equipment of this embodiment can be realized with techniques disclosed in Embodiments 1 to 5.

According to the present invention, TFTs having performance that meets the functional circuits are arranged on the semiconductor device (here, an electro-optical device) having plural functional circuits formed on the same substrate and, hence, to greatly enhance the operation characteristics.

According to the method of fabricating a semiconductor device of the present invention, there can be produced an active matrix substrate on which are formed p-channel TFTs and n-channel TFTs of a driver circuit having an LDD structure, and pixel TFTs by using five pieces of photomasks. A reflection-type liquid crystal display device can be fabricated by using the above active matrix substrate. Through the same steps, further, there can be fabricated a transmission-type liquid crystal display device using six pieces of photomasks.

According to the method of fabricating the semiconductor device of the invention, it is allowed to produce, by using six pieces of photomasks, an active matrix substrate of an LDD structure in which the p-channel TFTs, n-channel TFTs of the driver circuit and the pixel TFTs are overlapped on the gate electrodes, the TFTs having the gate electrode formed of a heat-resistant electrically conductive material and a gate wiring formed of a low-resistance electrically conductive material, as well as to fabricate a reflection-type liquid crystal display device using the active matrix substrate. It is further allowed to fabricate a transmission-type liquid crystal display device using seven pieces of photomasks through the same steps.

What is claimed is:

1. A semiconductor device comprising:

an active layer comprising a semiconductor film formed over a substrate having an insulating surface;

an insulating film formed on said active layer; and a gate electrode formed on said insulating film, wherein said active layer has a channel-forming region under said gate electrode, a low impurity concentration region for forming an LDD region, and at least one of a source and a drain regions, and wherein said insulating film on said low impurity concentration region has a thickness smaller than a thickness thereof on said channel-forming region, and is larger than a thickness thereof on said at least one of said source and drain regions.

2. A semiconductor device according to claim 1, wherein said gate electrode has a tapered portion.

3. A semiconductor device according to claim 1, wherein said low impurity concentration region exists between said channel-forming region and said at least one of said source region and said drain region.

4. A semiconductor device according to claim 1, wherein a concentration of at least one of a p-type and an n-type impurity elements contained in said low impurity concentration region increases as it separates away from said channel-forming region.

5. A semiconductor device according to claim 1, wherein said at least one of source and drain regions contain at least one of a p-type and an n-type impurity elements at a concentration higher than a concentration of the at least one of p-type and n-type impurity elements contained in said low impurity concentration region.

6. A semiconductor device according to claim 1, wherein a concentration of at least one of a p-type and an n-type impurity elements contained in said low impurity concentration region is from $1 \times 10^{16}$ to $1 \times 10^{20}$ atoms/cm$^3$.

7. A semiconductor device according to claim 1, wherein said insulating film covering said active layer has a tapered portion, and a length of said tapered portion is from 0.1 to 1 μm in a lengthwise direction of said channel-forming region.

8. A semiconductor device according to claim 1, wherein said gate electrode comprises a single-layer or a laminated-layer film of a heat-resistant conductive material selected from the group consisting of Ta, Ti, W, a compound of said material, a compound of a combination of said materials, a nitride of said material, and a silicide of said material.

9. A semiconductor device according to claim 1, wherein said gate electrode has a tapered angle of 5° to 35°.

10. A semiconductor device according to claim 1, wherein said semiconductor device is at least one selected from the group consisting of a personal computer, a video camera, a television, a portable data terminal, a digital camera, a digital video disk player, an electronic game machine, and a projector.

11. A semiconductor device comprising:

an active layer comprising a semiconductor film formed over a substrate having an insulating surface;

a tapered insulating film formed on said active layer; and a tapered gate electrode formed on said insulating film, wherein said active layer has a channel-forming region under said gate electrode, a low impurity concentration region for forming an LDD region, and at least one of a source and a drain regions, wherein said tapered insulating film on said low impurity concentration region has a thickness smaller than a thickness thereof on said channel-forming region, and a thickness larger than a thickness thereof on said at least one of source and drain regions, and wherein said low impurity concentration region has a gradient of concentration in a direction parallel to said substrate.

12. A semiconductor device according to claim 11, wherein said low impurity concentration region exists between said channel-forming region and said at least one of said source region and said drain region.

13. A semiconductor device according to claim 11, wherein a concentration of at least one of a p-type and an n-type impurity elements contained in said low impurity concentration region increases as it separates away from said channel-forming region.

14. A semiconductor device according to claim 11, wherein said at least source and drain regions contain at least one of a p-type and an n-type impurity elements at a concentration higher than a concentration of the at least one of the p-type and n-type impurity elements contained in said low impurity concentration region.

15. A semiconductor device according to claim 11, wherein a concentration of at least one of a p-type and an n-type impurity elements contained in said low impurity concentration region is from $1 \times 10^{16}$ to $1 \times 10^{20}$ atoms/cm$^3$.

16. A semiconductor device according to claim 11, wherein said insulating film covering said active layer has a tapered portion, and a length of said tapered portion is from 0.1 to 1 μm in a lengthwise direction of said channel-forming region.

17. A semiconductor device according to claim 11, wherein said gate electrode comprises a single-layer or a laminated-layer films of a heat-resistant conductive material selected from the group consisting of Ta, Ti, W, a compound of said material, a compound of a combination of said materials, a nitride of said material, and a silicide of said material.

18. A semiconductor device according to claim 11, wherein said tapered gate electrode has a taper angle of 5° to 35°.

19. A semiconductor device according to claim 11, wherein said semiconductor device is at least one selected from the group consisting of a personal computer, a video camera, a television, a portable data terminal, a digital camera, a digital video disk player, an electronic game machine, and a projector.

20. A semiconductor device comprising:

an active layer comprising a semiconductor film formed over a substrate having an insulating surface;

a tapered insulating film formed on said active layer; and a tapered gate electrode formed on said tapered insulating film, wherein said active layer has a channel-forming region under said gate electrode, a low impurity concentration region for forming an LDD region, and at least one of a source and a drain regions, wherein said tapered insulating film on said low impurity concentration region has a thickness smaller than a thickness thereof on said channel-forming region, and a thickness larger than a thickness thereof on said at least one of source and drain regions, and wherein a taper angle of said tapered gate electrode is larger than a taper angle of said tapered insulating film.

21. A semiconductor device according to claim 20, wherein said low impurity concentration region exists between said channel-forming region and said at least one of said source region and said drain region.

22. A semiconductor device according to claim 20, wherein a concentration of at least one of a p-type and an n-type impurity elements contained in said low impurity concentration region increases as it separates away from said channel-forming region.

23. A semiconductor device according to claim 20, wherein said at least one of source and drain regions contain at least one of a p-type and an n-type impurity elements at a concentration higher than a concentration of the at least one of p-type and n-type impurity elements contained in said low impurity concentration region.

24. A semiconductor device according to claim 20, wherein a concentration of at least one of a p-type and an n-type impurity elements contained in said low impurity concentration region is from $1 \times 10^{16}$ to $1 \times 10^{20}$ atoms/cm$^3$.

25. A semiconductor device according to claim 20, wherein said insulating film covering said active layer has a tapered portion, and a length of said tapered portion is from 0.1 to 1 $\mu$m in a lengthwise direction of said channel-forming region.

26. A semiconductor device according to claim 20, wherein said gate electrode comprises a single-layer or a laminated-layer films of a heat-resistant conductive material selected from the group consisting of Ta, Ti, W, a compound of said material, a compound of a combination of said materials, a nitride of said material, and a silicide of said material.

27. A semiconductor device according to claim 20, wherein said tapered gate electrode has a taper angle of 5° to 35°.

28. A semiconductor device according to claim 20, wherein said semiconductor device is at least one selected from the group consisting of a personal computer, a video camera, a television, a portable data terminal, a digital camera, a digital video disk player, an electronic game machine, and a projector.

29. A semiconductor device comprising:
a semiconductor layer formed over a substrate, said semiconductor layer comprising a channel-forming region, a first impurity region adjacent to said channel-forming region, and a second impurity region adjacent to said first impurity region;
an insulating film formed on said semiconductor layer; and
a gate electrode formed on said insulating film,
wherein said insulating film on said first impurity region has a thickness smaller than a thickness thereof on said channel-forming region, and is larger than a thickness thereof on said second impurity region.

30. A semiconductor device according to claim 29, wherein said second impurity region has a larger impurity concentration than said first impurity region.

31. A semiconductor device according to claim 29, wherein said first impurity region contains phosphorus at a concentration between $1 \times 10^{16}$ to $1 \times 10^{20}$ atoms/cm$^3$.

32. A semiconductor device according to claim 29, wherein said gate electrode comprises a single-layer or a laminated-layer film of a material selected from the group consisting of Ta, Ti, W, a compound of said material, a compound of a combination of said materials, a nitride of said material, and a silicide of said material.

33. A semiconductor device according to claim 29, wherein said semiconductor device is at least one selected from the group consisting of a personal computer, a video camera, a television, a portable data terminal, a digital camera, a digital video disk player, an electronic game machine, and a projector.

34. A semiconductor device comprising:
a semiconductor layer formed over a substrate, said semiconductor layer comprising a channel-forming region, a first impurity region adjacent to said channel-forming region, and a second impurity region adjacent to said first impurity region;
an insulating film formed on said semiconductor layer; and
a gate electrode formed on said insulating film, said gate electrode having a tapered portion,
wherein said insulating film on said first impurity region has a thickness smaller than a thickness thereof on said channel-forming region, and is larger than a thickness thereof on said second impurity region.

35. A semiconductor device according to claim 34, wherein said second impurity region has a larger impurity concentration than said first impurity region.

36. A semiconductor device according to claim 34, wherein said first impurity region contains phosphorus at a concentration between $1 \times 10^{16}$ to $1 \times 10^{20}$ atoms/cm$^3$.

37. A semiconductor device according to claim 34, wherein a taper angle of said gate electrode is between 5 and 35°.

38. A semiconductor device according to claim 34, wherein said gate electrode comprises a single-layer or a laminated-layer film of a material selected from the group consisting of Ta, Ti, W, a compound of said material, a compound of a combination of said materials, a nitride of said material, and a silicide of said material.

39. A semiconductor device according to claim 34, wherein said semiconductor device is at least one selected from the group consisting of a personal computer, a video camera, a television, a portable data terminal, a digital camera, a digital video disk player, an electronic game machine, and a projector.

40. A semiconductor device comprising:
a semiconductor layer formed over a substrate, said semiconductor layer comprising a channel-forming region, a first impurity region adjacent to said channel-forming region, and a second impurity region adjacent to said first impurity region;
an insulating film formed on said semiconductor layer; and
a gate electrode formed on said insulating film,
wherein said insulating film on said first impurity region has a thickness smaller than a thickness thereof on said channel-forming region, and is larger than a thickness thereof on said second impurity region, and
wherein said first impurity region has a gradient of concentration in a direction parallel with said substrate.

41. A semiconductor device according to claim 40, wherein said second impurity region has a larger impurity concentration than said first impurity region.

42. A semiconductor device according to claim 40, wherein said first impurity region contains phosphorus at a concentration between $1 \times 10^{16}$ to $1 \times 10^{20}$ atoms/cm$^3$.

43. A semiconductor device according to claim 40, wherein said gate electrode comprises a single-layer or a laminated-layer film of a material selected from the group consisting of Ta, Ti, W, a compound of said material, a compound of a combination of said materials, a nitride of said material, and a silicide of said material.

44. A semiconductor device according to claim 40, wherein said semiconductor device is at least one selected from the group consisting of a personal computer, a video camera, a television, a portable data terminal, a digital camera, a digital video disk player, an electronic game machine, and a projector.

45. A semiconductor device comprising:

a semiconductor layer formed over a substrate, said semiconductor layer comprising a channel-forming region, a first impurity region adjacent to said channel-forming region, and a second impurity region adjacent to said first impurity region;

a tapered insulating film formed on said semiconductor layer; and a tapered gate electrode formed on said insulating film, wherein said tapered insulating film on said first impurity region has a thickness smaller than a thickness thereof on said channel-forming region, and is larger than a thickness thereof on said second impurity region, and wherein a taper angle of said tapered gate electrode is larger than a taper angle of said tapered insulating film.

46. A semiconductor device according to claim 45, wherein said second impurity region has a larger impurity concentration than said first impurity region.

47. A semiconductor device according to claim 45, wherein said first impurity region contains phosphorus at a concentration between $1 \times 10^{16}$ to $1 \times 10^{20}$ atoms/cm$^3$.

48. A semiconductor device according to claim 45, wherein said taper angle of said tapered gate electrode is between 5 and 35°.

49. A semiconductor device according to claim 45, wherein a tapered portion of said tapered insulating film has a length between 0.1 and 1 μm along a lengthwise direction of said channel-forming region.

50. A semiconductor device according to claim 45, wherein said gate electrode comprises a single-layer or a laminated-layer film of a material selected from the group consisting of Ta, Ti, W, a compound of said material, a compound of a combination of said materials, a nitride of said material, and a silicide of said material.

51. A semiconductor device according to claim 45, wherein said semiconductor device is at least one selected from the group consisting of a personal computer, a video camera, a television, a portable data terminal, a digital camera, a digital video disk player, an electronic game machine, and a projector.

52. A semiconductor device comprising:

a semiconductor layer formed over a substrate, said semiconductor layer comprising a channel-forming region, a first impurity region adjacent to said channel-forming region, and a second impurity region adjacent to said first impurity region;

a tapered insulating film formed on said semiconductor layer; and a tapered gate electrode formed on said insulating film, wherein said tapered insulating film on said first impurity region has a thickness smaller than a thickness thereof on said channel-forming region, and is larger than a thickness thereof on said second impurity region, wherein said first impurity region has a gradient of concentration in a direction parallel with said substrate, and wherein a taper angle of said tapered gate electrode is larger than a taper angle of said tapered insulating film.

53. A semiconductor device according to claim 52, wherein said second impurity region has a larger impurity concentration than said first impurity region.

54. A semiconductor device according to claim 52, wherein said first impurity region contains phosphorus at a concentration between $1 \times 10^{16}$ to $1 \times 10^{20}$ atoms/cm$^3$.

55. A semiconductor device according to claim 52, wherein said taper angle of said tapered gate electrode is between 5 and 35°.

56. A semiconductor device according to claim 52, wherein a tapered portion of said tapered insulating film has a length between 0.1 and 1 μm along a lengthwise direction of said channel-forming region.

57. A semiconductor device according to claim 52, wherein said gate electrode comprises a single-layer or a laminated-layer film of a material selected from the group consisting of Ta, Ti, W, a compound of said material, a compound of a combination of said materials, a nitride of said material, and a silicide of said material.

58. A semiconductor device according to claim 52, wherein said semiconductor device is at least one selected from the group consisting of a personal computer, a video camera, a television, a portable data terminal, a digital camera, a digital video disk player, an electronic game machine, and a projector.

* * * * *